United States Patent
Bozalina et al.

(10) Patent No.: US 11,407,643 B2
(45) Date of Patent: Aug. 9, 2022

(54) LARGE SCALE PRODUCTION OF OXIDIZED GRAPHENE

(71) Applicant: NanoXplore Inc., Montreal (CA)

(72) Inventors: Marie Bozalina, Montreal (CA); Philippe Perret, Longueuil (CA); Soroush Nazarpour, Saint Therese (CA)

(73) Assignee: NanoXplore Inc., Montreal (CA)

( * ) Notice: Subject to any disclaimer, the term of this patent is extended or adjusted under 35 U.S.C. 154(b) by 142 days.

(21) Appl. No.: 16/692,201

(22) Filed: Nov. 22, 2019

(65) Prior Publication Data

US 2020/0207626 A1 Jul. 2, 2020
US 2022/0194799 A9 Jun. 23, 2022

Related U.S. Application Data

(63) Continuation of application No. 15/854,419, filed on Dec. 26, 2017, now Pat. No. 10,519,040, which is a (Continued)

(51) Int. Cl.
*C01B 32/19* (2017.01)
*C30B 33/00* (2006.01)
(Continued)

(52) U.S. Cl.
CPC ............ *C01B 32/19* (2017.08); *C01B 32/184* (2017.08); *C01B 32/23* (2017.08); *C30B 29/02* (2013.01);
(Continued)

(58) Field of Classification Search
CPC ....... C01B 32/19; C01B 32/23; C01B 32/184; C01B 2204/04; C30B 29/60; C30B 33/06;
(Continued)

(56) References Cited

U.S. PATENT DOCUMENTS

| | | |
|---|---|---|
| 5,871,586 A | 2/1999 | Crawley et al. |
| 7,071,258 B1 | 7/2006 | Jang et al. |

(Continued)

FOREIGN PATENT DOCUMENTS

| | | |
|---|---|---|
| CN | 102225759 A | 10/2011 |
| CN | 103288078 A | 9/2013 |

(Continued)

OTHER PUBLICATIONS

Shen, et al., Structural Disorder and Phase Transformation in Graphite Produced by Ball Milling, Nanostructured Materials 1996; 7(4): 393-399 (Year: 1996).*

(Continued)

*Primary Examiner* — Daniel C. McCracken
(74) *Attorney, Agent, or Firm* — Cooley LLP

(57) ABSTRACT

Embodiments described herein relate generally to the large scale production of functionalized graphene. In some embodiments, a method for producing functionalized graphene includes combining a crystalline graphite with a first electrolyte solution that includes at least one of a metal hydroxide salt, an oxidizer, and a surfactant. The crystalline graphite is then milled in the presence of the first electrolyte solution for a first time period to produce a thinned intermediate material. The thinned intermediate material is combined with a second electrolyte solution that includes a strong oxidizer and at least one of a metal hydroxide salt, a weak oxidizer, and a surfactant. The thinned intermediate material is then milled in the presence of the second electrolyte solution for a second time period to produce functionalized graphene.

22 Claims, 16 Drawing Sheets

Related U.S. Application Data continuation of application No. 15/413,804, filed on Jan. 24, 2017, now Pat. No. 9,890,046, which is a continuation of application No. 15/163,247, filed on May 24, 2016, now Pat. No. 9,586,825, which is a continuation of application No. PCT/CA2015/051292, filed on Dec. 8, 2015.

(60) Provisional application No. 62/089,583, filed on Dec. 9, 2014.

(51) Int. Cl.
| | |
|---|---|
| C30B 29/02 | (2006.01) |
| C30B 29/60 | (2006.01) |
| C01B 32/23 | (2017.01) |
| C30B 33/06 | (2006.01) |
| C30B 29/64 | (2006.01) |
| C30B 33/04 | (2006.01) |
| C30B 29/16 | (2006.01) |
| H01G 11/36 | (2013.01) |
| H01M 4/587 | (2010.01) |
| C01B 32/184 | (2017.01) |
| B82Y 30/00 | (2011.01) |
| B82Y 40/00 | (2011.01) |

(52) U.S. Cl.
CPC .............. *C30B 29/16* (2013.01); *C30B 29/60* (2013.01); *C30B 29/64* (2013.01); *C30B 33/00* (2013.01); *C30B 33/04* (2013.01); *C30B 33/06* (2013.01); *H01G 11/36* (2013.01); *H01M 4/587* (2013.01); *B82Y 30/00* (2013.01); *B82Y 40/00* (2013.01); *C01B 2204/04* (2013.01); *C01P 2006/40* (2013.01); *Y10S 977/734* (2013.01); *Y10S 977/847* (2013.01); *Y10S 977/948* (2013.01)

(58) Field of Classification Search
CPC ......... C30B 29/16; C30B 29/64; C30B 33/04; C30B 29/02; C30B 33/00; H01G 11/36; H01M 4/587; B82Y 30/00; B82Y 40/00; Y10S 977/734; Y10S 977/847; Y10S 977/948; C01P 2006/40; Y02E 60/10
See application file for complete search history.

(56) References Cited

U.S. PATENT DOCUMENTS

| | | |
|---|---|---|
| 7,566,410 B2 | 7/2009 | Song et al. |
| 7,623,340 B1 | 11/2009 | Song et al. |
| 7,662,321 B2 | 2/2010 | Guo et al. |
| 7,745,047 B2 | 6/2010 | Zhamu et al. |
| 7,785,492 B1 | 8/2010 | Jang et al. |
| 7,790,285 B2 | 9/2010 | Zhamu et al. |
| 7,824,651 B2 | 11/2010 | Zhamu et al. |
| 7,875,219 B2 | 1/2011 | Zhamu et al. |
| 7,892,514 B2 | 2/2011 | Jang et al. |
| 7,897,283 B2 | 3/2011 | Matsumoto et al. |
| 7,999,027 B2 | 8/2011 | Zhamu et al. |
| 8,084,121 B2 | 12/2011 | Yonetake et al. |
| 8,114,373 B2 | 2/2012 | Jang et al. |
| 8,114,375 B2 | 2/2012 | Jang et al. |
| 8,119,288 B2 | 2/2012 | Zhamu et al. |
| 8,132,746 B2 | 3/2012 | Zhamu et al. |
| 8,192,643 B2 | 6/2012 | Zheng et al. |
| 8,216,541 B2 | 7/2012 | Jang et al. |
| 8,222,190 B2 | 7/2012 | Zhamu et al. |
| 8,241,793 B2 | 8/2012 | Zhamu et al. |
| 8,268,902 B2 | 9/2012 | Casalini et al. |
| 8,278,757 B2 | 10/2012 | Crain et al. |
| 8,414,799 B2 | 4/2013 | Pu et al. |
| 8,501,318 B2 | 8/2013 | Jang et al. |
| 8,501,348 B2 | 8/2013 | Zhamu et al. |
| 8,524,067 B2 | 9/2013 | Zhamu et al. |
| 8,580,432 B2 | 11/2013 | Zhamu et al. |
| 8,611,070 B2 | 12/2013 | Ivanovici et al. |
| 8,652,687 B2 | 2/2014 | Zhamu et al. |
| 8,672,246 B2 | 3/2014 | Lee et al. |
| 8,696,938 B2 | 4/2014 | Zhamu et al. |
| 8,697,485 B2 | 4/2014 | Crain et al. |
| 8,747,623 B2 | 6/2014 | Zhamu et al. |
| 8,753,539 B2 | 6/2014 | Zhamu et al. |
| 8,753,543 B2 | 6/2014 | Zhamu et al. |
| 8,753,740 B2 | 6/2014 | Zhamu et al. |
| 8,765,302 B2 | 7/2014 | Chen et al. |
| 8,784,694 B2 | 7/2014 | Kay |
| 8,784,695 B2 | 7/2014 | Choi et al. |
| 8,795,899 B2 | 8/2014 | Liu et al. |
| 8,865,113 B2 | 10/2014 | Shankman |
| 8,871,296 B2 | 10/2014 | Zhamu et al. |
| 8,883,114 B2 | 11/2014 | Zhamu et al. |
| 9,327,981 B2 | 5/2016 | Gee et al. |
| 9,469,542 B2 | 10/2016 | Bozalina et al. |
| 9,586,825 B2 | 3/2017 | Bozalina et al. |
| 9,890,046 B2 | 2/2018 | Bozalina et al. |
| 10,322,935 B2 | 6/2019 | Bozalina et al. |
| 10,519,040 B2 | 12/2019 | Bozalina et al. |
| 2009/0022649 A1 | 1/2009 | Zhamu et al. |
| 2009/0169467 A1 | 7/2009 | Zhamu et al. |
| 2010/0140792 A1 | 1/2010 | Haddon et al. |
| 2010/0222482 A1 | 9/2010 | Jang et al. |
| 2011/0319554 A1 | 12/2011 | Frazier et al. |
| 2012/0077035 A1 | 3/2012 | Spahr et al. |
| 2013/0018204 A1* | 1/2013 | Jeon ..................... C01B 32/21 562/89 |
| 2013/0161199 A1 | 6/2013 | Li et al. |
| 2013/0211106 A1 | 8/2013 | El-Shall et al. |
| 2013/0309495 A1 | 11/2013 | Do et al. |
| 2014/0044968 A1 | 2/2014 | Papakonstantinou et al. |
| 2014/0255785 A1 | 9/2014 | Do et al. |
| 2015/0274532 A1 | 10/2015 | Fujiwara et al. |
| 2015/0279506 A1 | 10/2015 | Wolfrum et al. |
| 2020/0031674 A1 | 1/2020 | Bozalina et al. |

FOREIGN PATENT DOCUMENTS

| | | |
|---|---|---|
| CN | 103407998 A | 11/2013 |
| CN | 103570004 A | 2/2014 |
| CN | 103626162 A | 3/2014 |
| CN | 103708445 A | 4/2014 |
| KR | 101502390 B1 | 3/2015 |
| WO | WO 2011/054305 A1 | 5/2011 |
| WO | WO 2012/058553 A2 | 5/2012 |
| WO | WO 2012/117251 A1 | 9/2012 |
| WO | WO 2014/053510 A1 | 4/2014 |
| WO | WO 2014/138596 A1 | 9/2014 |
| WO | WO 2015/184555 A1 | 12/2015 |

OTHER PUBLICATIONS

Non-Final Office Action dated May 26, 2016 for U.S. Appl. No. 14/978,566, 12 pages.
Non-Final Office Action dated Feb. 15, 2018 for U.S. Appl. No. 15/270,855, 7 pages.
Non-Final Office Action dated Jul. 2, 2018 for U.S. Appl. No. 15/854,419, 6 pages.
Final Office Action dated Mar. 13, 2019 for U.S. Appl. No. 15/854,419, 14 pages.
Examination Report No. 1 dated Apr. 20, 2018 for Australian Application No. 2015271619, 4 pages.
Examination Report No. 2 dated Jan. 8, 2019 for Australian Application No. 2015271619, 5 pages.
Examination Report No. 1 dated Aug. 2, 2019 for Australian Application No. 2019205999, 5 pages.
Extended European Search Report dated Feb. 28, 2018 for European Application No. 15802987.6, 12 pages.
International Search Report and Written Opinion dated Sep. 1, 2015 for International Application No. PCT/CA2015/050525, 8 pages.

(56) References Cited

OTHER PUBLICATIONS

Examination Report No. 1 dated Oct. 3, 2018 for Australian Application No. 2015362043, 2 pages.
Extended European Search Report dated Jul. 4, 2018 for European Application No. 15867576.9, 7 pages.
International Search Report and Written Opinion dated Feb. 15, 2016 for International Application No. PCT/CA2015/051292, 9 pages.
Aparna, R. et al., "An effective route to rpoduce few-layer graphene using combinatorial ball milling and strong aqueous exfoliants," J. Reneweable Sustainable Energy 5: 033123 (2013); doi: 10.1063/1.4809794, 12 pages.
Eigler, S. & Hirsch, A., "Chemistry with Graphene and Graphene Oxide—Challenges for Synthetic Chemists," Angew. Chem. Int. Ed. 53: 7720-7738 (2014).
Knieke, C. et al., "Scalable production of graphene sheets by mechanical delamination," Carbon 48: 3196-3204 (2010).
Leon, V. et al., "Exfoliation of Graphite with Triazine Derivatives under Ball-Milling Conditions: Preparation of Few-Layer Graphene via Selective Noncovalent Interactions," ACS NANO, 8: 563-571 (2014).
Nonomura, Y. et al., "Anomalously stable dispersions of graphite in water/acetone mixtures," Journal of Colloid and Interface Science 346: 96-99 (2010).
Nuvoli, D. et al., "High concentration few-layer graphene sheets obtained by liquid phase exfoliation of graphite in ionic liquid," published electronically on Dec. 20, 2010, Journal of Materials Chemistry 21(10): 3428-3431 (2010).
Powell, M. et al., "The Selection and Design of Mill Liners," In Advances in Comminution, Ed. S.K. Kawatra. ISBN-13: 978-0-87335-246-8, Society for Mining, Metallurgy, and Exploration, Inc., Colorado, USA, pp. 331-376 (2006).
Sun, L., "Unexpected colloid-like supernatant from liquid-phase ball-milling graphite using miscible solutions as solvents: a failure analysis," online http://arxiv.org/ftp/arxiv/papers/1309/1309.1056, Sep. 4, 2013.
Tang, Q. et al., "Crystallization degree change of expanded graphite by milling and annealing," Journal of Alloys and Compounds 475: 429-433 (2009).
Woltornist, S. J. et al., "Conductive Thin Films of Pristine Graphene by Solvent Interface Trapping," ACS Nano 7(8): 7062-7066 (2013).
Yamanaka, S. et al., "Production of thin graphite sheets for a high electrical conductivity film by the mechanical delamination of ternary graphite intercalation compounds," Carbon 50: 5027-5033 (2012).
Yan, L. et al., "Electroactive and biocompatible hydroxyl-functionalized graphene by ball milling," J. Mater. Chem. 22: 8367-8371 (2012).
Zhang, D. et al., "High performance supercapacitor electrodes based on deoxygenated graphite oxide by ball milling," Electrochimica Acta 109: 874-880 (2013).
Zhang, L. L. et al., "Highly Conductive and Porous Activated Reduced Graphene Oxide Films for High-Power Supercapacitors," Nano Letters 12: 1806-1812 (2012).
Zhao, W. et al., "Preparation of graphene by exfoliation of graphite using wet ball milling," Journal of Materials Chemistry 20: 5817-5819 (2010).
Xing, W. et al., "Degradation of Graphene by Hydrogen Peroxide," Part. Part. Syst. Charact. 31: 745-750 (2014).
Non-Final Office Action dated Sep. 30, 2020 for U.S. Appl. No. 16/409,153, 8 pages.
Final Office Action dated Jun. 11, 2021 for U.S. Appl. No. 16/409,153, 9 pages.
Examination Report dated Jun. 2, 2021 for Canadian Application No. 2,947,776, 4 pages.

\* cited by examiner

LARGE SCALE PRODUCTION OF OXIDIZED GRAPHENE

CROSS-REFERENCE TO RELATED APPLICATIONS

This application is a continuation of U.S. patent application Ser. No. 15/854,419, filed Dec. 26, 2017, entitled "LARGE SCALE PRODUCTION OF OXIDIZED GRAPHENE," which is a continuation of U.S. patent application Ser. No. 15/413,804, filed Jan. 24, 2017, now U.S. Pat. No. 9,890,046, entitled "LARGE SCALE PRODUCTION OF OXIDIZED GRAPHENE," which is a continuation of U.S. patent application Ser. No. 15/163,247, filed May 24, 2016, now U.S. Pat. No. 9,586,825, entitled "LARGE SCALE PRODUCTION OF OXIDIZED GRAPHENE," which is a continuation of International Patent Application No. PCT/CA2015/051292, filed Dec. 8, 2015, entitled "LARGE SCALE PRODUCTION OF OXIDIZED GRAPHENE," which claims priority to and the benefit of U.S. Provisional Patent Application No. 62/089,583, filed Dec. 9, 2014, entitled "Large Scale Production of Partially Oxidized Graphene," the disclosures of which are hereby incorporated by reference in their entirety.

BACKGROUND

Graphene is a single, one atomic layer of carbon atoms with several exceptional electrical, mechanical, optical, and electrochemical properties, earning it the nickname "the wonder material." To name just a few, it is highly transparent, extremely light and flexible yet robust, and an excellent electrical and thermal conductor. Such extraordinary properties render graphene and related thinned graphite materials as promising candidates for a diverse set of applications ranging from energy efficient airplanes to extendable electronic papers. For example, graphene based batteries may allow electric cars to drive longer and smart phones to charge faster. Other examples include graphene's ability to filter salt, heavy metals, and oil from water, efficiently convert solar energy, and when used as coatings, prevent steel and aluminum from rusting. In the longer term, thinned crystalline graphite in general promises to give rise to new computational paradigms and revolutionary medical applications, including artificial retinas and brain electrodes.

SUMMARY

Embodiments described herein relate generally to the large scale production of functionalized graphene. In some embodiments, a method for producing functionalized graphene includes combining a crystalline graphite with a first electrolyte solution that includes at least one of a metal hydroxide salt, an oxidizer, and a surfactant. The crystalline graphite is then milled in the presence of the first electrolyte solution for a first time period to produce a thinned intermediate material. The thinned intermediate material is combined with a second electrolyte solution that includes a strong oxidizer and at least one of a metal hydroxide salt, a weak oxidizer, and a surfactant. The thinned intermediate material is then milled in the presence of the second electrolyte solution for a second time period to produce functionalized graphene.

DETAILED DESCRIPTION

Figure 1:
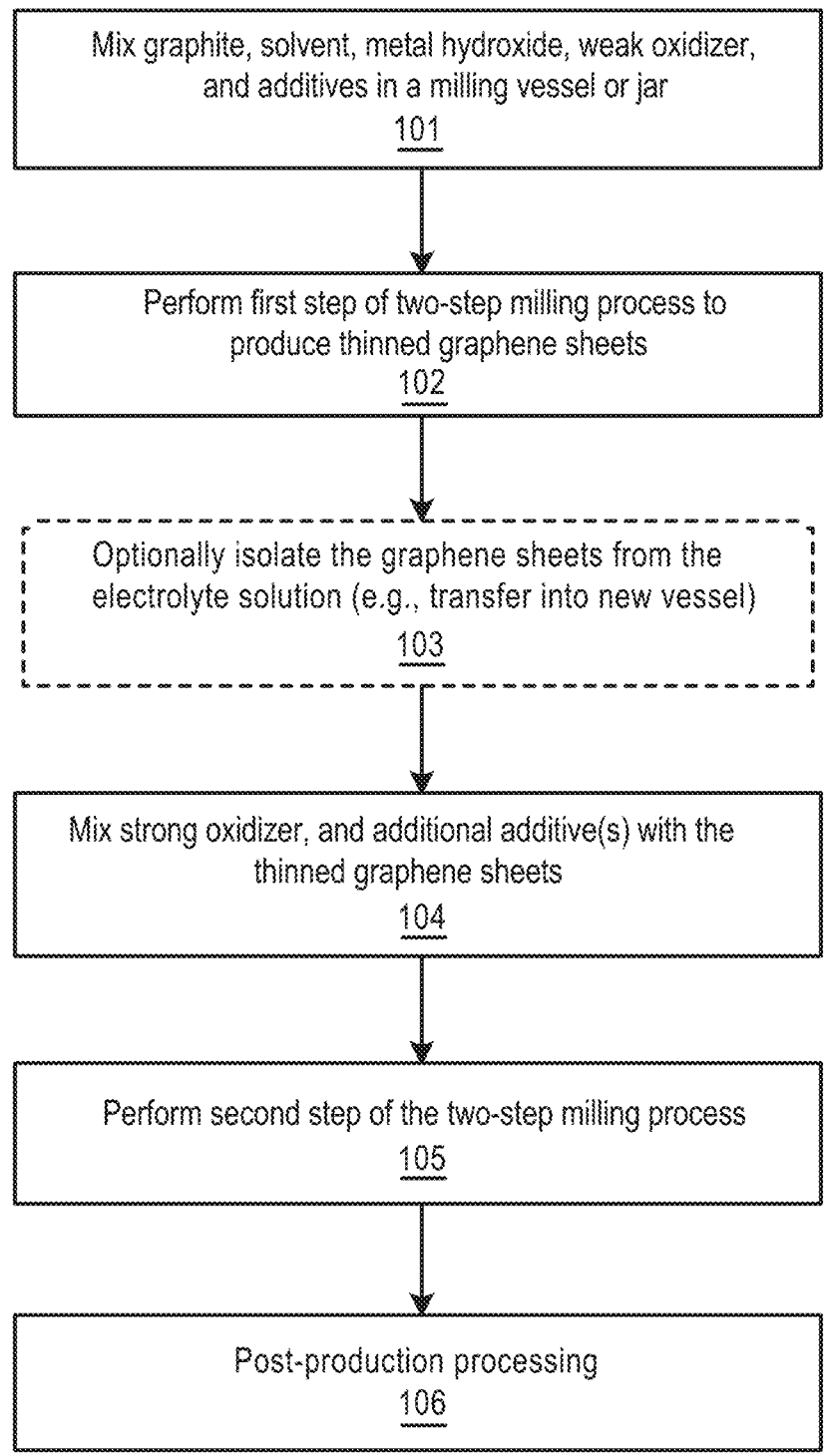
FIG. 1 is a schematic flowchart illustrating a method of producing functionalized graphene, according to an embodiment.
Figure 2B:
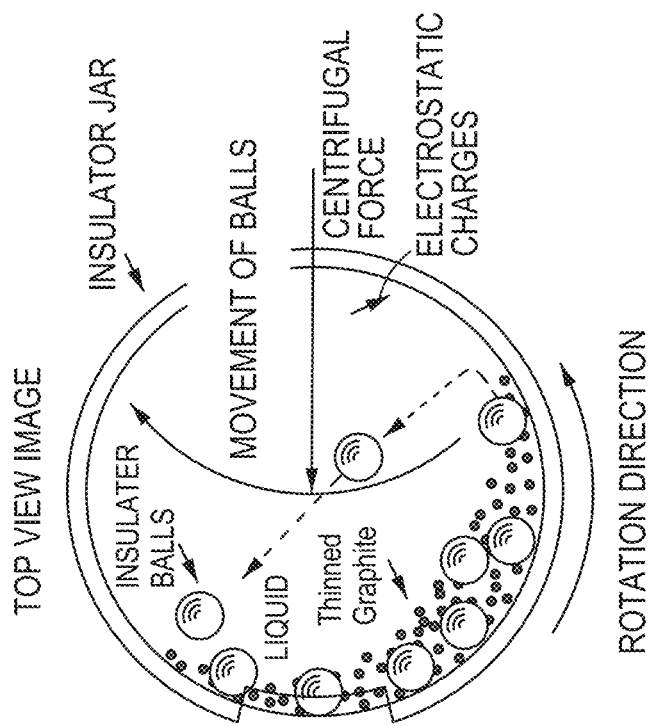
FIGS. 2A and 2B show example schematics of the process of milling in a vessel containing graphite, grinding media and an electrolyte solution, according to an embodiment.
Figure 2A:
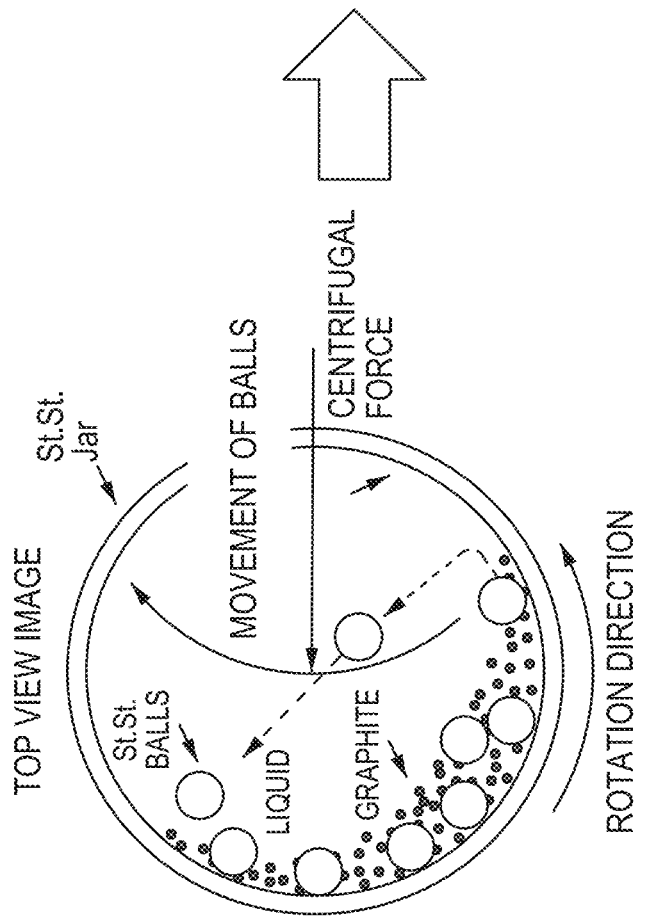

Embodiments described herein relate generally to large scale synthesis of charged and functionalized graphene sheets, and in particular, at least partially oxidized graphene sheets via a two-step thinning and oxidation process of precursor crystalline graphite. Graphene sheets are very attractive for use as additives in products such as, but not limited to, lubricants, paints, composites, special aqueous fluids including drilling fluids and thermal transfer liquids, and/or the like. In some embodiments, the oxidation processes disclosed herein can increase the mixability and/or dispersibility of graphene in such products, and in solvents (e.g., polar, non-polar, etc.) in general.

In general, defects that occur in graphene and thinned graphite tend to concentrate at the edges of the graphitic materials, leaving the surface with relatively low or no concentration of defects. In such embodiments, selective functionalization of the graphene edges leads to the preservation of the desirable properties of graphene surfaces (which may be defect-free, in some cases) while using the defected edges of graphene to enhance the mixability and/or dispersibility of graphene. As edges of graphene flakes are less conductive than the low or no-defect surfaces of the flakes, electrostatic charges produced during the milling processes of the disclosed embodiments tend to accumulate more on the edges than on the surfaces, leading to the selective functionalization of graphene (e.g., resulting in electrostatically charged and hydroxylated graphene sheets) if favorable chemical conditions are met. In some embodiments, the oxidation chemistry of the electrolyte comprising the graphene flakes or sheets can be tuned to convert the hydroxyl ions at the edges to a mixture of hydroxyls and carbonyls, which can enhances the mixability and/or dispersibility of the functionalized graphene flakes or sheets in polar as well as non-polar solvents.

In some embodiments, the processes of the present disclosure include a two-step milling process wherein highly charged (electrostatically), hydroxylated and oxidized thinned graphitic materials are produced starting with a precursor crystalline graphite material. As used herein, the term "thinned graphite" refers to crystalline graphite that has had its thickness reduced to a thickness from about a single layer of graphene to about 1,200 layers, which is roughly equivalent to about 400 nm. As such, single layer graphene sheets, few-layer graphene (FLG) sheets, and in general multi-layer graphene sheets with a number of layers about equal to or less than 1,200 graphene layers can be referred as thinned graphite. As used herein, the term "few-layer graphene" (FLG) refers to crystalline graphite that has a thickness from about 1 graphene layer to about 10 graphene layers.

In some embodiments, the disclosed processes for thinning precursor crystalline graphite may also reduce the lateral size of the precursor crystalline graphite. In other words, as layers of graphene sheets are removed from crystalline graphite, the in-plane sizes of the resulting thinned product may also be reduced. In such embodiments, the quality of the thinned product and/or the efficiency of the thinning process may be represented by a parameter such as an aspect ratio that incorporates information on the thickness and the lateral size of the thinned graphitic material. For example, one may define the aspect ratio as the ratio of lateral size or in-plane dimension to thickness. Note that other definitions for an aspect ratio are possible and may be adopted based on the circumstances of the situation (e.g., based on geometry of the product, etc.). In general, the aspect ratio provides information on the "efficiency" and/or effectiveness of producing thinned graphite while avoiding or minimizing reduction in lateral sheet size. For example, if a thinned crystalline graphite product has an average lateral dimension of 300 μm and a thickness of 200 nm, the aspect ratio as defined above becomes 300,000/200 (i.e., 1,500). However, a process that reduces the thickness of the same precursor graphite to 100 nm while attaining average lateral dimension of 100 μm (i.e., aspect ratio of 1,000) may be deemed as less efficient, and the end result may be considered as lower quality in comparison to the previous example (even with a thinner end result) since the lateral size is reduced comparatively on a larger scale.

In some embodiments, the precursor and/or the resulting thinned graphite may not have a regular shape that allows for a convenient identification of a measure of a lateral size, or even a thickness. For example, as described herein, the precursor graphite can assume different forms, including rods, fibers, powders, flakes, and/or the like. However, in some embodiments, depending on at least the geometry of the precursor graphite/thinned graphite, generalized definitions of thickness and/or lateral size can be used in characterizing these quantities. In some embodiments, the thickness and/or the in-plane lateral size of crystalline graphite in irregular forms can be characterized by a suitable linear dimension, and/or average of linear dimensions. For example, the thickness can be defined as some suitable length (e.g., height from topmost layer to bottom-most layer of a regularly layered graphite flake, average height if irregularly shaped, etc.) in substantially the same direction as the direction normal to the surfaces of the layered graphene sheets. As another example, the lateral size of crystalline graphite may be defined by some appropriate linear dimension and/or combination of dimensions along the surface of the graphite (e.g., radius, diameter, average of several linear dimensions along the surface, a linear dimension appropriately normalized by shape factors that take the geometrical irregularity of the graphite into consideration, etc.). In any case, suitable linear dimensions that characterize the thickness and the lateral size of crystalline graphite in a reasonable manner may be used in defining the aspect ratio as the ratio of the lateral size to the thickness. For example, if the in-plane shape of the material can not be modeled by regular geometrical objects relatively accurately, the linear dimension can be expressed by characteristic parameters as is known in the art (e.g., by using shape or form factors).

In some embodiments, the processes disclosed herein for thinning precursor graphitic materials can produce thinned graphite (e.g., single layer, bilayer, few-layer and multi-layer graphene, etc.) of varied thicknesses and lateral sizes. For example, the disclosed thinning process can achieve thinned end products with thickness (as defined above, for example) less than about 1,500 layers (approximately 500 nm), about 400 nm, about 300 nm, about 200 nm, about 100 nm, about 50 nm, about 30 nm, about 10 nm, etc. In some embodiments, the lateral sizes (as defined above, for example) of the thinned end products may be as large as about 500 μm, about 250 μm, about 100 μm, about 1000 nm, about 500 nm, about 250 nm, about 100 nm, about 50 nm, about 10 nm, etc. As such, thinned graphitic products with a wide range of aspect ratios ranging from about 10 nm/500 nm (about 0.2) to about 500 μm/10 nm (about 50,000) can be obtained from the thinning processes disclosed in the instant application.

In some embodiments, as indicated above, the aforementioned two-step milling process brings about not only the thinning of precursor graphite into single, few-layer and/or multi-layer graphene sheets, but also the charging and functionalization of the thinned graphitic material. As will be described below in more details, the thinning and/or functionalization of graphite can be facilitated by oxidizers that may play varied roles based on their oxidation potential. For example, during the first step of the two-step thinning process, a "weak" oxidizer may be used to facilitate the shearing of sheets of graphene from the precursor graphite. In some embodiments, this can be accomplished when the oxidizer interacts with electrostatic charges in the electrolyte solution comprising the oxidizer and causes the release of atomic oxygen, which then intercalates the layered crystalline graphite and weakens the bonds between the layers. In some embodiments, a "weak" oxidizer refers to a chemical agent with an oxidation potential less than about 1.5V, about 1.25V, about 1.0V, about 0.75V, about 0.5V, about 0.25V, about 0V, about −1V, about −2V, about −3V, etc.

In some embodiments, during the second step of the two-step milling process, a "strong" oxidizer may be used to facilitate the conversion of hydroxyls bonded to the edges of a hydroxylated graphitic material into carbonyl groups. In other words, the strong oxidizer leads to the at least partial oxidation of graphene sheets where hydrogen atoms from the hydroxyls at the hydroxylated edges are released, leaving behind oxygen doubly bonded to a carbon atom, i.e., partially oxidized graphene sheets. In most embodiments, the oxidizers capable of facilitating the conversion of hydroxyls to carbonyls have strong oxidation potentials, hence the term "strong" oxidizer. In some embodiments, a "strong" oxidizer refers to a chemical agent with an oxidation potential greater than about 1.5V, about 1.6V, about 1.75V, about 1.9V, about 2.25V, about 2.5V, about 2.75V, about 3V, etc.

In some embodiments, methods and systems for producing electrostatically charged and hydroxylated graphene sheets from crystalline precursor graphite are disclosed. In some of these embodiments, the methods include a two-step process where the crystalline graphite (e.g., flake graphite (FG) powder) can be thinned to single, few or multi-layer graphene sheets with charged edges that facilitate the hydroxylation and/or carbonyl-ation of the edges of the graphene sheets. In some embodiments, the first step of the two-step process comprises combining large crystalline precursor graphite with electrolyte slurry into a grinding vessel or jar such as, but not limited to, an attritor. In some embodiments, the electrolyte slurry includes at least a metal hydroxide (MH) salt and an aqueous solution comprising a polar solvent (e.g., water, ethanol, 1-propanol), a weak oxidizer and a surfactant. The grinding vessel and/or the associated grinding media may be chosen based on the amount of electrostatic charge one desires to generate during the disclosed processes; as such, a selection of the grinding vessel and/or the associated grinding media can be used as a control over the charging level of the thinned graphene sheets. For example, vessels or jars made from insulating material such as Alumina or Zirconia accompanied with same/similar type of grinding balls generate higher electrostatic charges than stainless steel jars and balls. Another parameter that can be used to control the generation and amount of the electrostatic charge to be produced during the disclosed milling processes is the rotation speed. For example, medium rotation speed of the grinding vessel can introduce electrostatic charges on and within the electrolyte, resulting in the ionization of the MH salt.

In some embodiments, the hydroxide ions released into the electrolyte slurry from the MH salt can diffuse into the interlayer spacing of the layered crystalline precursor graphite, i.e., the hydroxide ions intercalate graphite so as to cause the formation of n-stage intercalated graphite. In such embodiments, n can be any one of natural numbers less than the number of graphene layers in the crystalline precursor graphite. For example, n can be 1, 2, 3, 4, 5, etc. In some embodiments, the n-stage intercalated graphite can be a combination of different stage intercalated graphite. For example, the hydroxide ions can intercalate graphite so as to cause the formation of 1-stage and 2-stage intercalated graphite, and/or the like. In some embodiments, this may facilitate the exfoliation of layers of graphene sheets from the precursor graphite by the shearing forces induced during the rotation of the grinding vessel or jar. In some embodiments, the resulting graphene sheets tend to maintain the initial lateral size of precursor graphite while their thickness may be dramatically lowered, in particular in comparison to the thickness of the initial precursor graphite. In some embodiments, the resulting graphene product (which may include thinned graphitic materials such as, but not limited to, single, few and multi-layer graphene sheets, etc.) may be post-processed (e.g., filtered, washed, dried, and/or the like) so as to at least remove extraneous by-products. In some embodiments, at the end of the first stage of the two-step milling process, the resulting graphene product may appear to be black, and may exhibit a fluffy structure. Further, the resulting product may be electrostatically highly charged and contain hydroxyl molecules, and the electrostatic charges and the hydroxyl molecules may appear more at the edges of the resulting graphene sheets than on the surface (e.g., towards the center).

In some embodiments, in the second stage of the two-step milling process, the graphitic product from the first step (e.g., dried graphene sheets) may be combined with a slurry that includes at least an MH salt, a strong oxidizer, and an aqueous solution including a polar solvent (e.g., water), a non-polar solvent (e.g., acetonitrile), a weak oxidizer and a surfactant. This combination may be effected in several ways. For example, the resulting graphene products may be transferred into a second grinding vessel containing at least some of the ingredients of the second step of the two-step process (e.g., strong oxidizer, non-polar solvent, weak oxidizer, etc.). In some embodiments, ingredients that are particularly used during the second step such as, but not limited to, the strong oxidizer, the non-polar solvent, etc., may be added into the grinding vessel of the first step of the two-step processes. In any case, in some embodiments, the combination comprising the graphene products of the first step process, a strong oxidizer, a weak oxidizer, a polar solvent, a non-polar solvent, an MH salt and a surfactant may be rotated in a grinding vessel (e.g., attritor) for a period of time at a desired rotation speed. In some embodiments, the resulting hydroxylated product may appear to be brown and exhibit a fluffy structure. In some embodiments, the resulting product may be post-processed (e.g., filtered, washed, dried, and/or the like). In some embodiments, the resulting product can be at least partially oxidized thinned graphene sheets with hydroxylated edges where at least part of the hydroxyls bonded to the edges of the graphene sheets are converted into carbonyl molecules. As the carbonyl molecules tend to be more active for bonding than the hydroxyl groups, in some embodiments, the resulting at least partially oxidized graphene sheets represent an enhanced dispersibility and/or mixability in different kinds of solutions including polar and non-polar solvents.

In some embodiments, the first step of the two-step process comprises the thinning precursor crystalline graphite in the presence of an electrolyte solution. As used herein, the term "crystalline graphite" or "precursor crystalline graphite" refers to graphite based material of a crystalline structure with a size configured to allow milling in a grinding or milling vessel or jar. For example, the crystalline graphite can be layered graphene sheets with or without defects, such defects comprising vacancies, interstitials, line defects, etc. The crystalline graphite may come in diverse forms, such as but not limited to ordered graphite including natural crystalline graphite, pyrolytic graphite (e.g., highly ordered pyrolytic graphite (HOPG)), synthetic graphite, graphite fiber, graphite rods, graphite minerals, graphite powder, flake graphite, any graphitic material modified physically and/or chemically to be crystalline, and/or the like. In some embodiments, the crystalline graphite can be graphite oxide. The lateral or in-plane size as well as the thickness of the ordered graphite can assume a wide range of values. For example, using an appropriate measure to quantify the lateral size of the ordered graphite as discussed above (e.g., mean lateral sizes, diameter, etc., depending on the shape, for example), the lateral sheet size of the ordered graphite can range from about 10 nm to about 500 μm. The thickness of the graphite can be as large as desired as long as its size may not interfere with the milling or thinning processes.

In some embodiments, the electrolyte solution in which the two-step milling process takes place comprises polar solvents. An example of a polar solvent may be purified water such as, but not limited to, double distilled deionized water. Other examples include propanol, butanol, acetic acid, ethanol, methanol, formic acid, and/or the like. In some embodiments, some of these solvents may also be used for other purposes during the milling process. For example, ethanol may be used as a de-foaming agent.

In some embodiments, during the two-step milling process, a weak oxidizer may be used to interact with hydroxyl ions to generate atomic oxygen that can intercalate graphite and weaken the interlayer van der Waals bonds. Owing to its conductive characteristics, the weak oxidizer can be used as a dissipating agent for the electrostatic charges produced during the milling process. That is, the weak oxidizer may be configured to assist with the dissipation of the electrostatic charges throughout the electrolyte solution. As used herein, a "weak" oxidizer refers to a chemical agent with an oxidation potential less than about 1.5V. Examples of a weak oxidizer include diluted hydrogen peroxide, chromate, chlorate, perchlorate, and/or the like. In this context, a diluted oxidizer may mean an oxidizer that contains about 30% by weight of the oxidizing agent. For example, a diluted weak hydrogen peroxide oxidizer has about 30% by weight of the oxidizing agent hydrogen peroxide. In some embodiments, the diluted oxidizer may contain from about 10% to about 50%, from about 15% to about 45%, from about 20% to about 40%, from about 25% to about 35%, and/or the like of the oxidizing agent by weight. In some embodiments, the discussion above with respect to MH salt applies to both steps of the disclosed two-step process.

In some embodiments, a metal hydroxide (MH) salt configured to interact with electrostatic charges to produce metal and hydroxide ions can be added into the grinding vessel or jar of the two-step process disclosed herein. As discussed above, the hydroxyl ions may further interact with electrostatic charges to generate atomic oxygen that can intercalate crystalline graphite and weaken the interlayer van der Waals bonds so as to facilitate the shearing of the graphene sheets of the graphite. In some embodiments, the hydroxide ions can also diffuse into the interlayer spacing of the layered crystalline precursor graphite to intercalate graphite and facilitate the exfoliation of graphene sheets by the shearing forces generated during the rotation of the grinding vessel or jar. In some embodiments, the metal hydroxide salt can be formed from a combination of a hydroxyl ion and a metal selected from alkali metals, alkaline earth metals, boron group elements, etc. Examples of metal hydroxide salts that can be used for the disclosed two-step processes include hydroxides of Li, Na, K, Cs, Be, Mg, Ca, Sr, Ba, B, Al, Ga, In, Cs, Rb, Ti, mixtures thereof, and/or the like. In some embodiments, the amount of metal hydroxide salt to be used in the disclosed processes can assume a wide range of values. For example, in some embodiments, the amount of metal hydroxide salt may range from about 1% to about 30% by weight about X % to about Y % by volume of the electrolyte solutions of the two step process. In some embodiments, the amount may range from about 5% to about 25%, from about 10% to about 20%, from about 14% to about 16% by weight, etc. In some embodiments, the amount may be any amount equal to or less than the maximum amount that is soluble in the electrolyte solution. In some embodiments, in particular for the purpose of doping resulting graphene sheets with metal particles, the amount of metal hydroxide salt can be increased to about 90% of the solution by volume.

In some embodiments, the type of MH salt that may be used in the two-step process may depend on the desired production yield of the process to reduce the precursor crystalline graphite into thinned and charged graphene sheets. In some embodiments, production yield may be defined as the proportion of precursor graphitic material that has been reduced to thinned graphite of a defined number of graphene sheets or less. In some embodiments, the production yield of the two step process may vary based on the type of metal that is part of the MH salt. For example, in some embodiments, for a high production yield of greater than about 60% (i.e., greater than about 60% of the precursor graphite by weight is converted into thinned graphene of about 10 layers as a result of the process), the metal that is part of the MH salt may be a member of the alkali and/or alkaline earth metals, comprising Li, Na, K, Cs, Be, Mg, Ca, Sr and Ba. In some embodiments, for a low production yield of less than about 60%, the metal may be a member of the boron group elements, comprising B, Al, Ga, In, and Ti. In some embodiments, the MH salt used in the milling or grinding processes disclosed herein may be a single MH salt comprising a metal and a hydroxide ion, and in some embodiments, the MH salt may be a mixture of any of the above-identified metal hydroxide salts. In some embodiments, the discussion above with respect to MH salt applies to both steps of the disclosed two-step process.

In some embodiments, surfactants can be included in the two-step process so as to avoid or minimize clamping of the end products of the process. Further, surfactants may increase the conductivity of the mixture in the grinding vessel, allowing for an increased diffusion of the hydroxyl ions and thereby contributing to the exfoliation of graphene layers from the crystalline graphite as discussed above. In addition, surfactants may be used to facilitate the mixing of polar and non-polar solvents that in general are adverse to mixing. Further, surfactants may also be used to facilitate contact between an ingredient that is adverse to mixing with a given solvent and the solvent. For example, surfactants may be used to facilitate contact between hydrophobic graphite materials and water. Examples of surfactants that can be used for such purpose during two-step process comprise sodium dodecyl sulfate (SDS), sodium dodecyl benzene sulfonate, pyridinium (PY+), thionin acetate salt, triton, mixtures thereof, and/or the like.

In some embodiments, the concentration of surfactants to be used during the milling processes can be determined based on the desire to maintain balance between the thinning of the crystalline graphite and the reduction in its lateral size. As discussed above, in some embodiments, surfactants enhance the shearing force on crystalline graphite and facilitate the thinning of the crystalline graphite. On the other hand, a large amount of surfactants (e.g., more than the amount used to avoid or minimize agglomeration of crystalline graphite) can lead to reduction in lateral size, which may be undesirable in some circumstances. Accordingly, in some embodiments, an average concentration of between about 1 μMolar and about 200 μMolar of surfactants can be considered sufficient during the thinning and charging processes of precursor graphite. In some embodiments, the average concentration may range from about 5 µMolar to about 150 µMolar, from about 10 µMolar to about 100 µMolar, from about 10 µMolar to about 50 µMolar, from about 50 µMolar to about 100 µMolar, and/or the like. In some embodiments, the discussion above with respect to surfactants applies to both steps of the disclosed two-step processes.

In some embodiments, the electrolyte solution used for the two-step milling process can have a very conductive and alkaline environment. For example, the pH level may range from almost neutral to very strong basic. In some embodiments, the pH level may range from about 8 to about 14, from about 9 to about 14, from about 9 to about 11, from about 12 to about 14, and/or the like. The alkalinity may follow as a result of the small ionization potential of MET salt upon dissolving in the solvent(s) of the electrolyte solution.

In some embodiments, the disclosed two-step grinding or milling processes can be carried out in any type of grinding or milling system that comprises a vessel and allows for the shearing, exfoliation, charging, hydroxylation, etc., of the crystalline precursor graphite. Examples of such a system that can be used for the two-step process include milling vessels such as but not limited to ball mills, rod mills, pebble mills, autogenous mills, semi-autogenous mills, roller mills (e.g., jar roller mills, ring mills, frictional-ball mills, etc.), attritors, planetary mills, jet mills, aerodynamic mills, shear mixers, and/or the like. In some embodiments, the mill jars or vessels can be made from conductive materials, insulators and/or semi-conductors, including ceramic materials, alumina, stainless steel, and/or zirconia, and can also be lined with materials such as polyurethane, rubber, etc. In some embodiments, the vessels may include grinding media for aiding in the grinding/shearing of precursor materials such as graphite. In some embodiments, the grinding media can be made from the same type of materials as the vessel or jar in which the grinding media are being used. As such, for example, the vessels and/or the grinding media may be electrically conductive, and comprise materials such as stainless steel, metals and/or alloys (e.g., tungsten carbide). In some embodiments, the vessels and/or the grinding media may be coated with electrically conductive material. In general, the vessels and/or the grinding media may be configured to conduct electric charges. For example, the grinding media can be made from alumina, zirconia, stainless steel, etc. In some embodiments, the grinding media may assume different forms. For example, the grinding media can be at least substantially a ball (hence the common term "ball milling"), at least substantially a cylinder, at least substantially a rod, and in fact any shape capable of aiding in the grinding/shearing of precursor materials. As used herein, the term "grinding media" or "milling balls" refer to any grinder that can be used in the exfoliation and thinning of crystalline graphite in ball milling jars. Even though the common nomenclature "milling balls" is used, the grinding media or the milling balls are not limited to a particular geometry, and can have any desired property such as shape, size, composition, etc.

In some embodiments, with reference to FIG. 1, crystalline graphite, a solvent (e.g., polar), grinding media, a MH salt, a weak oxidizer and a surfactant can be added into a milling vessel to commence the first step of the two-step milling process, e.g., step 101. For example, large flake size graphite powder, water, hydrogen peroxide, a metal hydroxide salt such as potassium hydroxide (KOH), and a surfactant such as SDS may be added into a milling vessel. In some embodiments, electrolyte mixtures such as the one in the preceding example may be placed into a milling vessel or jar made from electrically conductive materials such as stainless steel, metal or alloys, and milled or rotated for a period of time and at a speed of rotation configured to generate electrostatic charges in the electrolyte mixture, e.g., step 102. In some embodiments, the speed of the rotation may be configured to reduce the initial thickness of the graphite without substantially affecting its lateral size. For example, the stronger mechanical interaction between the grinding media and the crystalline graphite that could result as a result of higher milling vessel rotational speed can reduce not only the thickness of the crystalline graphite, but also its lateral size. Accordingly, during the first step of the two-step milling process, the milling speed can range from about 10 rotations per minute (rpm) to about 500 rpm. In some embodiments, the milling speed can range from about 10 rpm to about 300 rpm, from about 10 rpm to about 250 rpm, from about 10 rpm to about 150 rpm, from about 10 rpm to about 100 rpm, from about 50 rpm to about 300 rpm, from about 150 rpm to about 250 rpm, from about 200 rpm to about 250 rpm, and/or the like.

In some embodiments, the number and/or sizes of grinding media in the milling vessel or jar can depend on milling process related factors such as but not limited to the running time, the rotational speed, amount/size of the crystalline graphite, average size of the grinding media, and/or the like. For example, for a given amount of crystalline graphite, there can be some milling ball sizes (conversely number of milling balls) that can be particularly beneficial in effecting a more efficient shearing of crystalline graphite layers depending on the speed and the length of the ball milling process. In some embodiments, the grinding media may be small sized balls and their amount may be chosen based on the amount of crystalline graphite to be treated. For example, the amount of the grinding media may be chosen so that during the milling process, the weight proportion of grinding media to crystalline graphite may be in the range of from about 5:1 to about 20:1. In some embodiments, the proportion may be in the range of from about 7:1 to about 15:1, from about 9:1 to about 12:1, about 10:1, and/or the like. In such embodiments, the average size of the grinding media (e.g., balls) may be in the range of from about 3 mm to about 20 mm, from about 5 mm to about 15 mm, from about 8 mm to about 12 mm, and/or the like.

In some embodiments, the duration of the first step milling process to reduce the thickness of the precursor graphite and arrive at hydroxylated thinned graphite or graphene sheets may range from about from about 2 hours to about 24 hours. In some embodiments, the duration may range from about 2 hours to about 12 hours, from about 2 hours to about 6 hours, from about 2 hours to about 4 hours, and/or the like.

In some embodiments, the rotation during the two-step process may generate a shearing force by the grinding media that may be configured to provide enough energy to the electrostatic charges in the electrolyte solution to react with the salts (which may be polarized) in the solution. In some embodiments, the reaction between the electrostatic charges and the MH salt may generate atomic oxygen. An additional mechanism for the generation of atomic oxygen in the electrolyte mixture can be through the interaction of the weak oxidizer with the hydroxyl ions that may be present in the mixture (from the MH salt, for example). In such embodiments, the weak oxidizer may interact with the hydroxyl ions to release atomic oxygen that may also be used for the exfoliation of the graphite. For example, in some embodiments, the generated and/or released atomic oxygen may diffuse in between layers of the crystalline graphite and increase the in-plane separation. When the in-plane distance passes beyond a certain distance, in some embodiments, inter-planar bonds (covalent, van der Waals, etc.) of graphite may become weak enough that a gentle shearing force may exfoliate the layers from the crystalline graphite. In some embodiments, hydroxyl anions in the electrolyte may also diffuse in between layers of graphite and weaken the inter-layer bonding. In some embodiments, the solvent may also penetrate between layers of the ordered graphite and weaken the forces that hold the layers together, thereby contributing to the thinning of the crystalline graphite during the milling process.

In some embodiments, the first step milling process may be interrupted every so often to allow the escape of gas for various reasons (e.g., safety). For example, in some embodiments, the milling process may be stopped every 30 minutes to evacuate gas by-products that are produced during the rotation/milling of the milling vessel. In some embodiments, the process of milling may also be performed in a manner designed to avoid evaporation of solvents such as water from the aqueous electrolyte solution. For example, milling vessels or jars used in the milling processes may be kept at a temperature formulated to avoid evaporation of the solvents, an example being room temperature.

In some embodiments, the resulting product of the first milling step may appear black and possess a fluffy structure. This resulting product may be post-processed to at least remove extraneous by-products or residues such as, but not limited to, metallic ions, surfactants, metal salts, etc. For example, the product may be removed from the milling vessel or jar and washed with one or more of water, hydrochloric acid (HCl), ethanol, and/or the like, e.g., step 103 of FIG. 1. In some embodiments, the washing may be followed by vacuum filtration and vacuum drying. The resulting product can be single or thinned few layer graphene (FLG) sheets that are highly charged and hydroxylated mainly at the edges, in some embodiments.

In some embodiments, the graphene sheets from the first step of the two-step milling process may include graphene or thinned graphite materials with lateral sizes that are comparable to the precursor graphite but with thickness of few graphene layers, including single layer graphene sheet. For example, the lateral sheet size of the graphene sheets may be about 500 µm while the number of layers may be between about 10 and about 100 graphene layers, less than about 10 graphene layers, less than about 3 graphene layers, and a single graphene sheet. In some embodiments, the graphene sheets may be highly electrostatically charged and may contain hydroxyl molecules that reside mostly on the edges rather than towards the center of the surfaces of the graphene sheets. As such, this may lead to the selective functionalization of the edges in comparison to the entire surfaces of the thinned graphene sheets.

At least some embodiments of the first step of the disclosed two-step milling process have been employed experimentally to reduce the thickness of precursor crystalline graphite and produce highly electrostatically charged, hydroxylated graphene sheets. In some embodiments of the experimental results, at least some of these graphene sheets can be conveniently classified into the following classes or grades:

Grade A: A few-layer graphene powder of about 3 to 4 graphene layers and lateral size (e.g., flake diameter) of about 5 µm to 20 µm. These graphene sheets have been found to exhibit highly activated edges and low defect density.

Grade B: A few-layer graphene powder of about 2 to 3 graphene layers and lateral size (e.g., flake diameter) of about 0.5 µm to 5 µm. These graphene sheets have been found to exhibit highly activated edges and low defects.

Grade C: A few-layer graphene powder with similar properties as Grade A, but with moderately activated edges.

Grade D: A few-layer graphene powder with similar properties as Grade B, but with moderately activated edges.

Figure 3B:
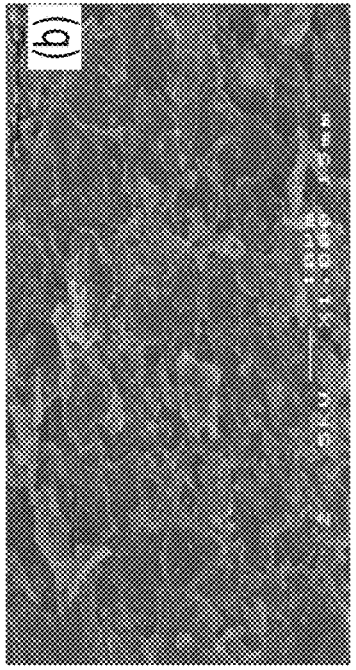
FIGS. 3A-3F are a series of SEM micrographs of a wide variety of few-layer graphene, according to an embodiment.
Figure 3D:
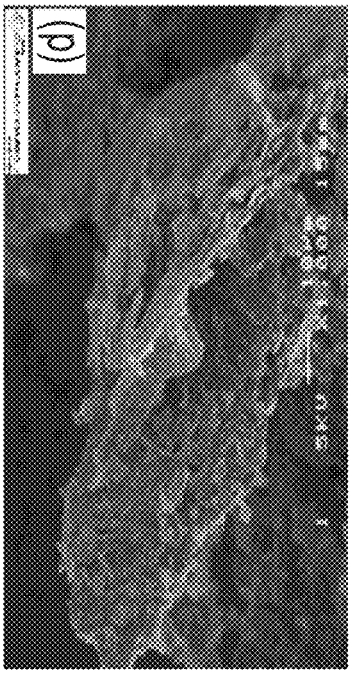
Figure 3F:
Figure 3A:
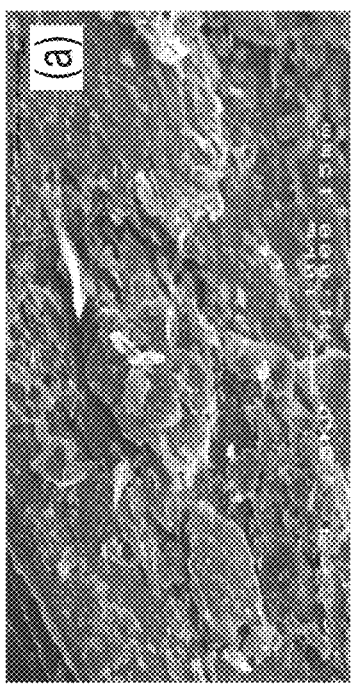
Figure 3C:
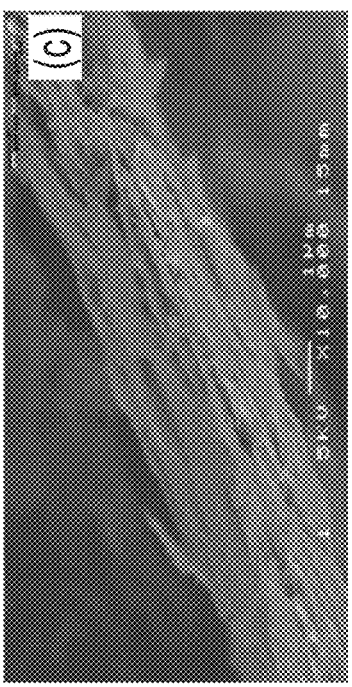
Figure 3E:
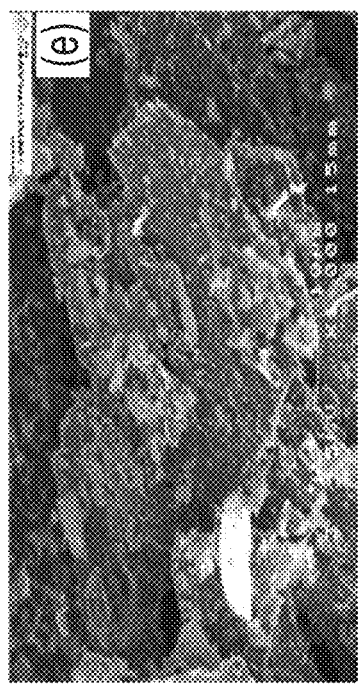
Figure 4A:
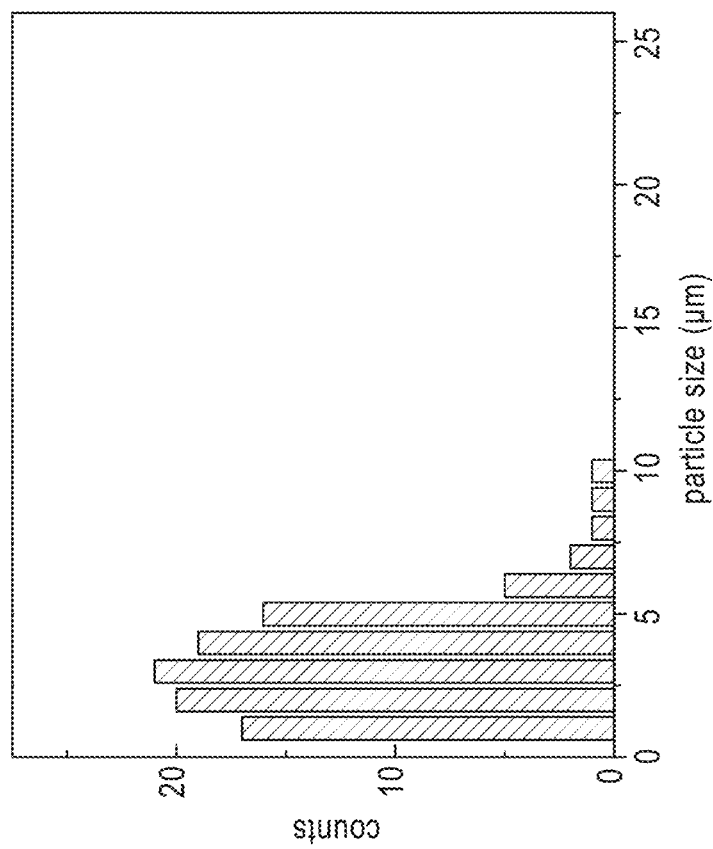
FIGS. 4A and 4B are plots of the lateral size distribution of graphene-based particles that comprise few-layer graphene samples, according to an embodiment.
Figure 4B:
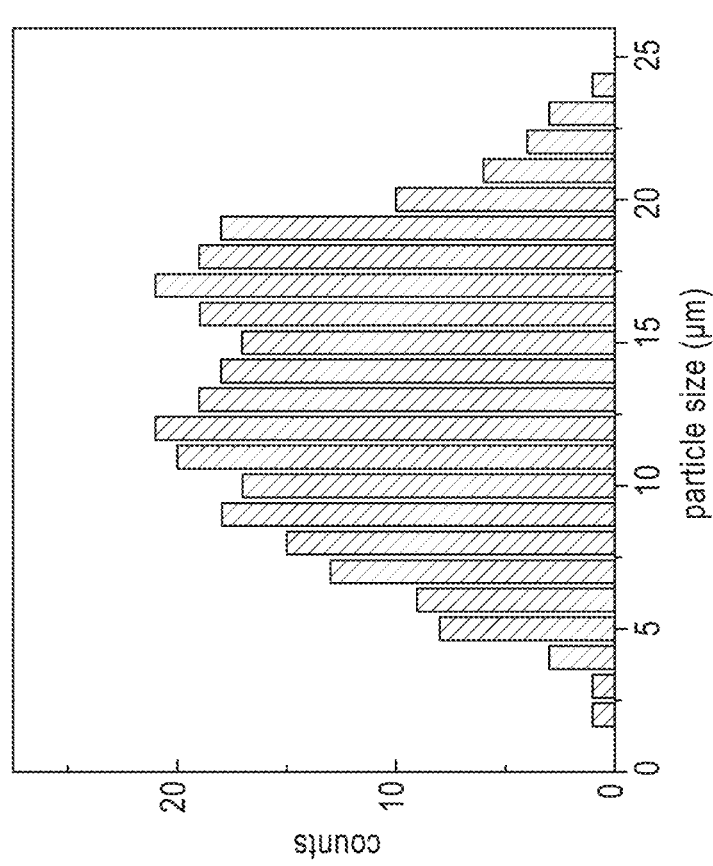

In some embodiments, the lateral sizes and the thicknesses of these various grades may be obtained from any number of experimental techniques. For example, FIGS. 3A-3F show scanning electron microscopy (SEM) images of thinned graphene products that belong in Grade A (FIG. 3A), Grade B (FIG. 3B), Grade C (FIG. 3C), and Grade D (FIG. 3D). From an analysis of the SEM images, in some embodiments, grades A and C have been found to include particles or flakes ranging in lateral size from about 5 µm to about 20 µm (FIG. 4A), and grades B and D include particles ranging in lateral size from about 0.5 µm to about 5 µm (FIG. 4B). In some embodiments, in addition to size information, the analysis may also reveal the distribution of structures of the graphene sheets from the first step. For example, Grade B (FIG. 3B) shows thin layered structures stacked together.

Figure 5:
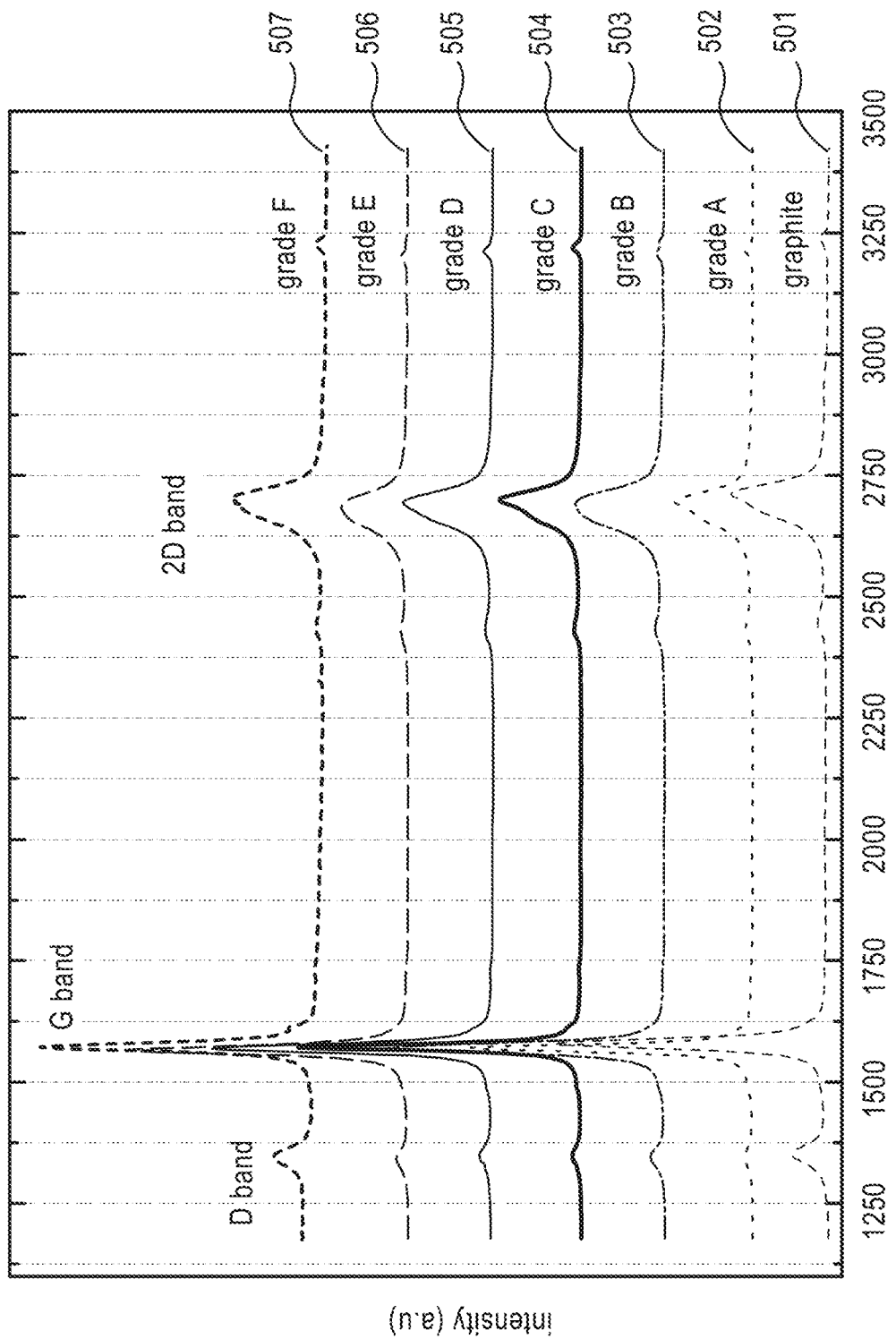
FIG. 5 is a plot of Raman spectra for a series of different few-layer graphene sheets, and bulk graphite, according to an embodiment.
Figure 6A:
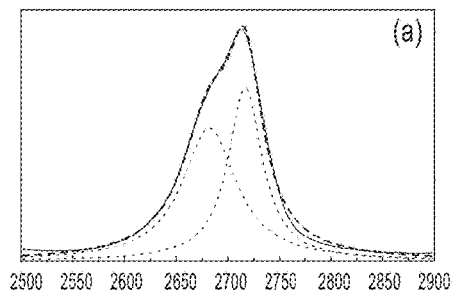
FIGS. 6A-6G are plots showing the two peak deconvolution of the Raman spectra of different few-layer graphene sheets and bulk graphite indicating the presence of a plurality of graphene layers, according to an embodiment.
Figure 6B:
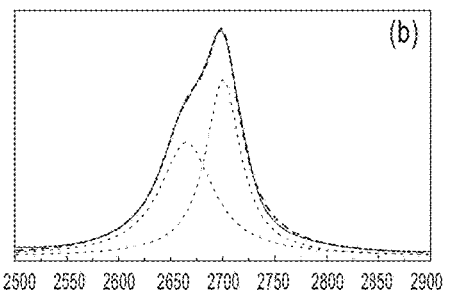
Figure 6C:
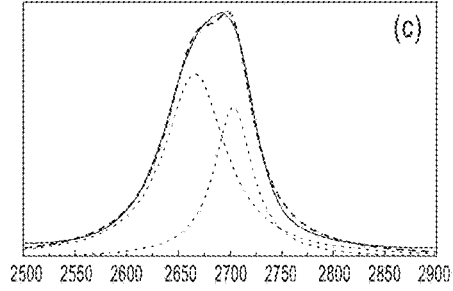
Figure 6D:
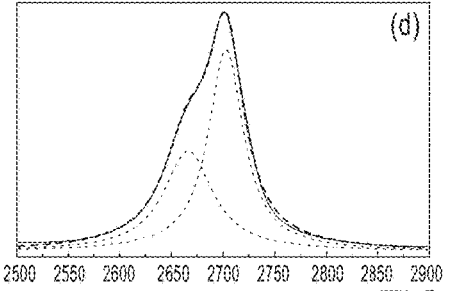
Figure 6E:
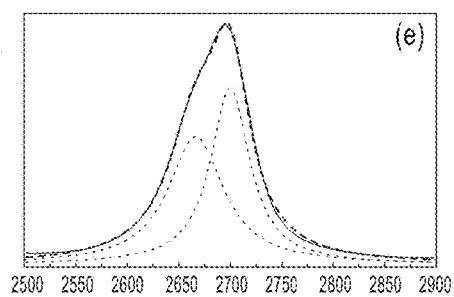
Figure 6F:
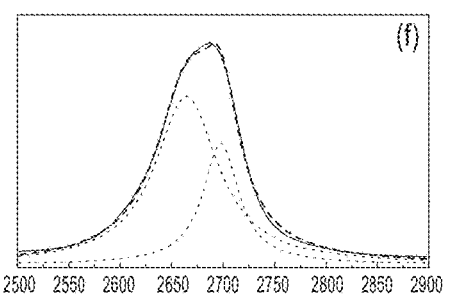
Figure 6G:
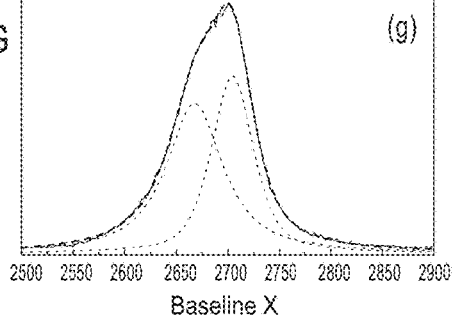

With respect to thickness and defect density of the resulting products of the milling process, in some embodiments, Raman spectroscopy can be used to characterize these properties. In some embodiments, visible light (e.g., 532 nm wavelength light corresponding to 2.33 eV energy) may be used to obtain Raman spectra for bulk crystalline graphite, Grade A few layer graphene (FLG) 502, Grade B FLG 503, Grade C FLG 504 and Grade D FLG 505, shown in FIG. 5. In FIG. 5, the Raman spectra for all the grades show peaks that are the result of in-plane vibrational modes caused by excitations due to the laser used for the spectroscopy. These peaks or bands include the primary in-plane mode of the so-called G band around wavenumber 1580 $cm^{-1}$, a different in-plane vibration mode of the so-called D band around wavenumber 1300 $cm^{-1}$, and a second-order overtone of the D band, the so-called 2D band around wavenumber 2700 $cm^{-1}$. Analysis of the D peaks as discussed in Phys. Rev. Lett., 97, 187401 (2006) and Journal of Physics: Conference Series 109 (2008) 012008, the entire contents of both of which are incorporated herein by reference in its entireties, can provide information on the thicknesses of the graphene sheets of the different grades resulting from the disclosed milling processes. In some embodiments, one may also use the techniques disclosed in J. Raman Spectrosc. 2009, 40, 1791-1796, the entire contents of which is incorporated herein by reference in its entirety, to analyze the G peaks and evaluate the number of layers in the graphene sheets. Further, in some embodiments, an analysis of the D peaks and the G band with respect to each other may reveal information on defect density of the graphene sheets. For example, the ratio of the intensity at the G band to the intensity at the D band may serve as a parameter for characterizing defect density. For example, a large ratio may indicate the presence of little or no defects in the resulting graphene products while a small value of the ratio indicates large defect presence. From the results of the Raman spectroscopy (FIG. 5), the average value of the ratio for the graphene sheets of Grades A, B, C, and D can be calculated to be about 20, a large value indicating low numbers of defects in the resulting graphene sheets of the first step of the two-step process (and further indicating that the graphene sheets have large sizes).

Figure 7A:
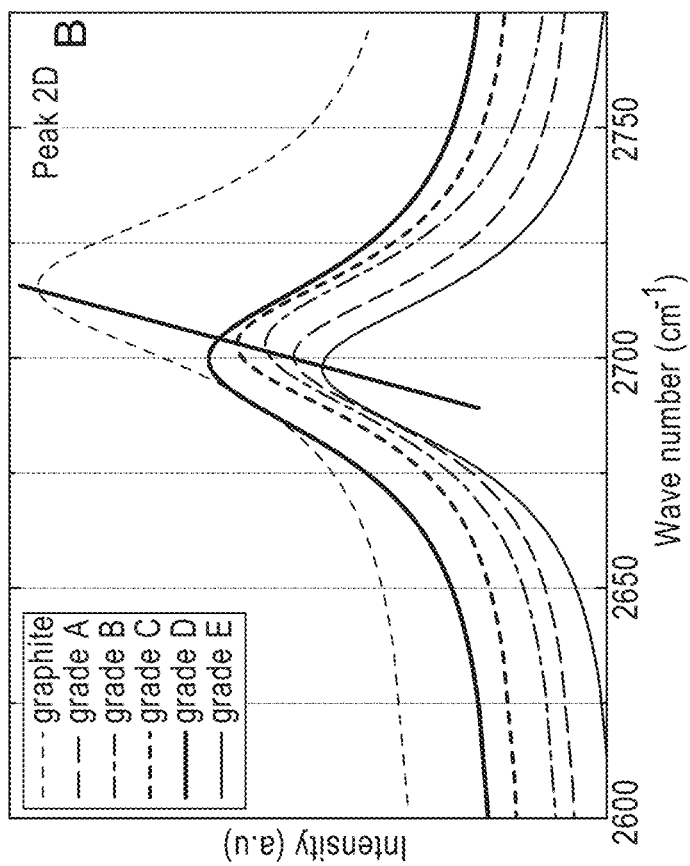
FIGS. 7A and 7B are plots showing the shift of the 2D band peak as a function of the thickness of few-layer graphene samples, according to an embodiment.
Figure 7B:
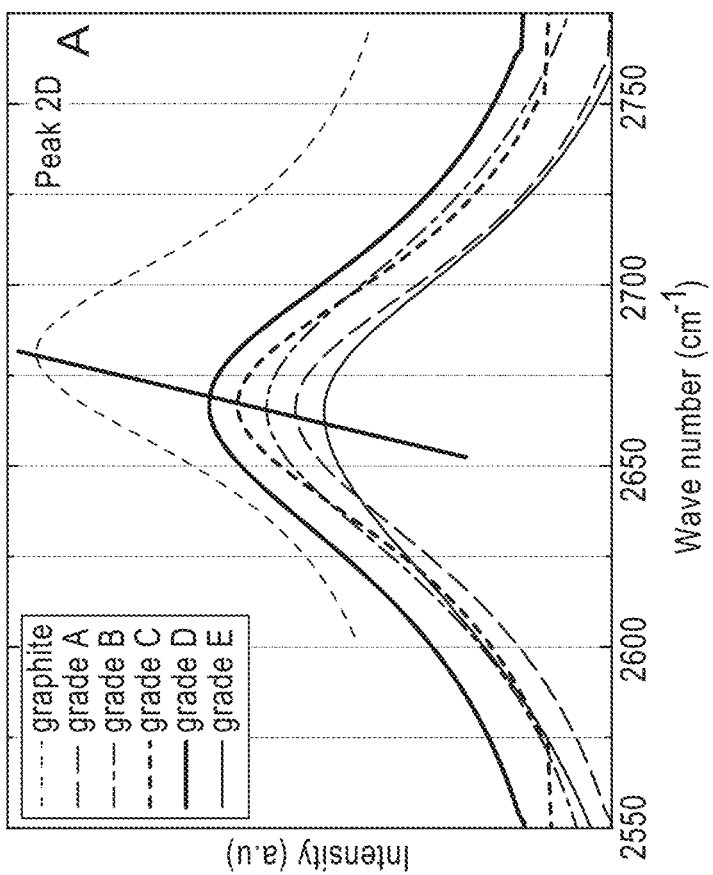
Figure 8:
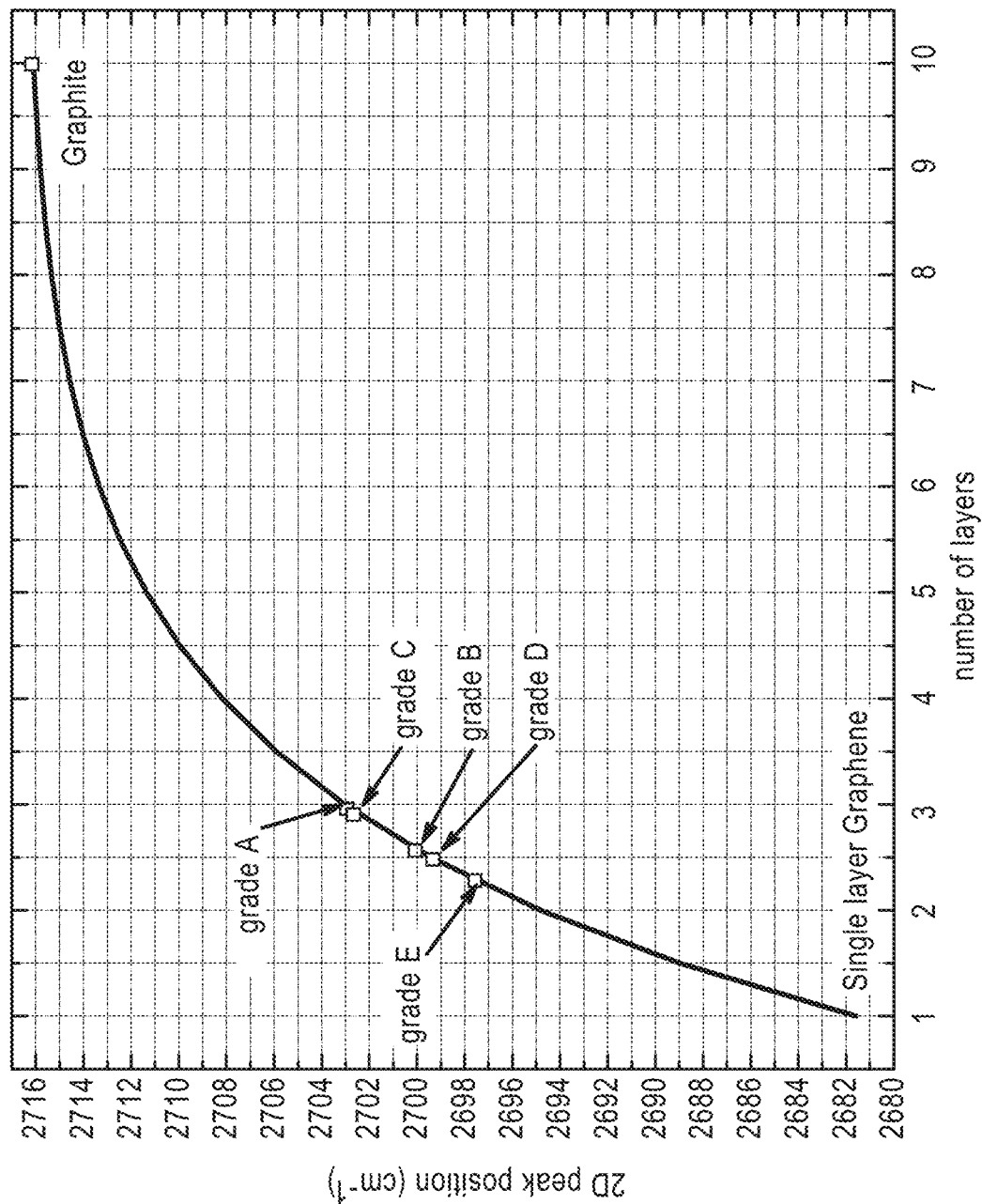
FIG. 8 is alternative plot providing a compact view of the number of layers in few-layer graphene samples, according to an embodiment.

With respect to the analysis of the D peaks, in some embodiments, changes in shape, width, and position of the 2D peaks of the Raman spectra may be used to identify the thicknesses of the grades of graphene sheets being investigated. Using the techniques discussed in the above noted Journal of Physics article (Journal of Physics: Conference Series 109 (2008) 012008), a two peaks deconvolution using Lorentzian functions can be chosen, as shown in FIGS. 6A-6G, indicating that the number of layers exceeded two. In some embodiments, an analytical comparison of the 2D peaks amongst the different grade graphene sheets may reveal that the 2D peak shifts from a higher wavenumber for crystalline graphite with large number of graphene sheets to a lower wavenumber for few-layer graphene such as the thinned products of Grade D, as shown in FIGS. 7A-B. In some embodiments, one may compare the 2D peak positions for the different grades with the data provided in Chem. Comm., 2011, 47, 9408-9410, the entire contents of which is incorporated herein by reference in its entirety, to establish the number of layers in the graphene sheets of Grades A-D and bulk crystalline graphite. FIG. 8 provides a compact view of the number of layers of the graphene sheets of Grades A-D and bulk crystalline graphite in relation to the 2D peak positions. A tabulation of the 2D peaks and the number of layers for each grade is given in the table below:

| Sample | $2D_A$ peak position | $2D_B$ peak position | Number of layers |
|---|---|---|---|
| Graphite | 2682.03 cm$^{-1}$ | 2716.67 cm$^{-1}$ | >=10 |
| Grade A | 2665.26 cm$^{-1}$ | 2700.34 cm$^{-1}$ | 2 to 3 |
| Grade B | 2666.09 cm$^{-1}$ | 2703.01 cm$^{-1}$ | 4 to 5 |
| Grade C | 2666.28 cm$^{-1}$ | 2702.82 cm$^{-1}$ | 2 to 3 |
| Grade D | 2666.37 cm$^{-1}$ | 2699.72 cm$^{-1}$ | 4 to 5 |

Figure 9:
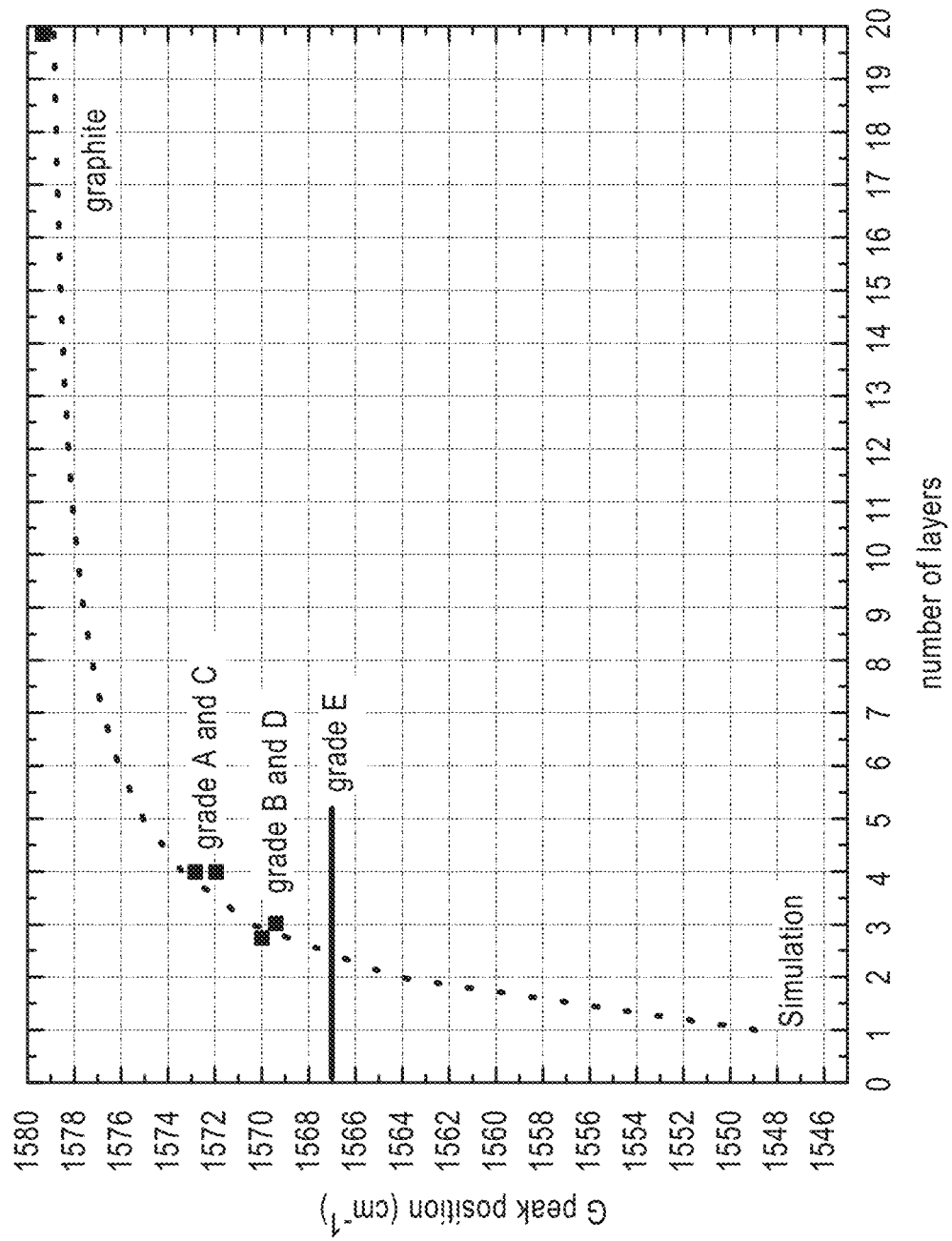
FIG. 9 is a plot showing simulated results of the number of layers in few-layer graphene samples, according to an embodiment.

With respect to the analysis of the G peak, in some embodiments, one may employ the disclosure of the noted J. Raman Spectroscopy article (J. Raman Spectrosc. 2009, 40, 1791-1796) to perform an empirical evaluation of the number of layers can also be determined from G peak position using the equation $$N = N_{Graphite} - \frac{K}{1+n^{1.6}}$$

where N is the wavenumber of the G peak of the FLG n is the number of layers, $N_{Graphite}$ is the wavenumber of bulk graphite corresponding to large value of n (e.g., n>10), and K a calculated coefficient. For example, using the wavenumber for the aforementioned G peaks of Grade A-D, and setting the wavenumber of bulk graphite $N_{Graphite}$ to be about 1579.38 cm$^{-1}$, the coefficient K can be calculated to be about 54±3. In some embodiments, this method of evaluation gives some consistent results for grades B and D with about 2 to 3 layers; however, in some embodiments, a small difference can be observed for Grades A and B indicating up to 4 layers (e.g., instead of 3). FIG. 9 provides calculated values for the number of layers of the graphene sheets of Grades A-D and bulk crystalline graphite in relation to the G peak positions. From a synthesis of the above two methods (analysis of the D peaks and the G peaks) of determining the number of layers in samples of Grades A-D, in some embodiments, a reasonable determination of about 2-3 layers for Grades B and D and about 3-4 for Grades A and C can be made.

As mentioned above, in some embodiments, graphene sheets that are the result of the first step of the disclosed two-step process are highly charged and contain edges that are hydoxylated, i.e., hydroxyl groups (OH$^-$) are bonded to the edges of the graphene sheets. The appearance of hydroxyl groups at the edges serve as chemical "hooks" for the graphene sheets, and an experimental technique such as X-ray Photon Spectroscopy (XPS) may be used to identify the hydroxyl groups and characterize the surfaces also. For example, for the graphene sheets of grades A, B, C and D, FIGS. 10A-10F show the XPS spectra of Grade A (FIG. 10A), Grade B (FIG. 10B), Grade C (FIG. 10C) and Grade D (FIG. 10D) with some of the peaks corresponding to the atomic orbitals identified. In some embodiments, deconvolution can be performed to semi-quantify the carbon species on the surface where the same pattern was used for all five grades. In some embodiments, four intensity peaks may be identified:

Peak from carbon sp$^2$ due to graphitic carbon. In some embodiments, this peak may be the most intense because graphene is composed of a vast majority of carbon atoms in sp$^2$.

Peak from carbon sp$^3$ due to tetrahedral bonded carbon. This carbon species can be found on the edges of the graphene platelets.

Peak from carbon-oxygen (C—O) is due to the hydroxyl groups on the edges of graphene platelets. This shows that the milling process is capable of effectively functionalizing graphene platelets edges.

Peaks from π-π are typical of graphitic carbon and can be attributed to resonance. The presence can be expected in graphene because this is a graphitic material.

Integrals, i.e., summation of the intensities of each peak for each grade are tabulated below, indicating that all grades comprise activated edges with hydroxyl groups.

TABLE 1

| | C1s sp3 | C1s sp2 | C1s C—O | C1s C=O | C1s π-π * |
|---|---|---|---|---|---|
| Grade A | 10.19 | 58.85 | 22.84 | 0 | 8.12 |
| Grade B | 9.23 | 61.71 | 18.54 | 0 | 10.51 |
| Grade C | 9.63 | 61.84 | 22.61 | 0 | 5.92 |
| Grade D | 10.01 | 61.95 | 21.21 | 0 | 6.84 |
| Grade F | 14.69 | 53.19 | 17.2 | 3.94 | 10.98 |

Confirmation of the presence of hydroxyl groups at the edges of the graphene sheets may be obtained from other techniques such as Fourier transform infrared spectroscopy by attenuated total reflection (ATR-FTIR), which may be used to characterize the edge activation and other properties of the various grades. FIG. 12 shows that all grades exhibit the C—O stretching mode around 1060 cm$^{-1}$ and the C—OH stretching mode around 1200 cm$^{-1}$. These modes confirm the presence of hydroxyl groups over the graphene flakes. Around 1600 cm$^{-1}$ the vibration of graphitic domains is observed for the graphene sheets of grades A-D, but not for bulk graphite due to the high number of graphitic layers. This is further evidence that graphene sheets of grades A through D comprise few-layers of graphene, unlike the bulk or large numbers for graphite. The O—H stretching mode around 3400 cm$^{-1}$ has been observed only on the 13.2 (Grade C). This mode was also expected on all other grades. FIGS. 13A-D provide additional example plots of X-ray photon spectroscopy (XPS) (FIG. 13A), Raman (FIG. 13B), TGA (FIG. 13C), and Fourier transform infrared spectroscopy (FTIR) (FIG. 13D) spectra of electrostatically charged and hydroxylated graphene, according to an embodiment.

Figure 12A:
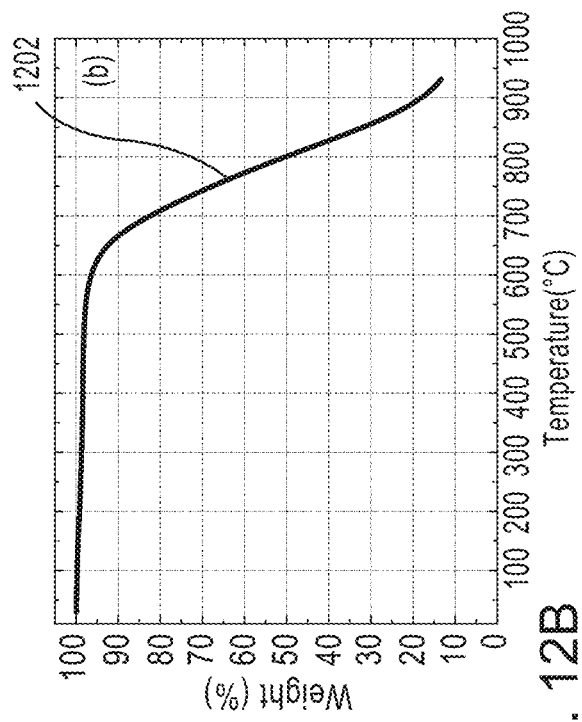
FIGS. 12A-D are plots showing the results of thermo gravimetric analysis of different few-layer graphene, and bulk graphite indicating the thermal stability of these graphene-based materials.
Figure 12B:
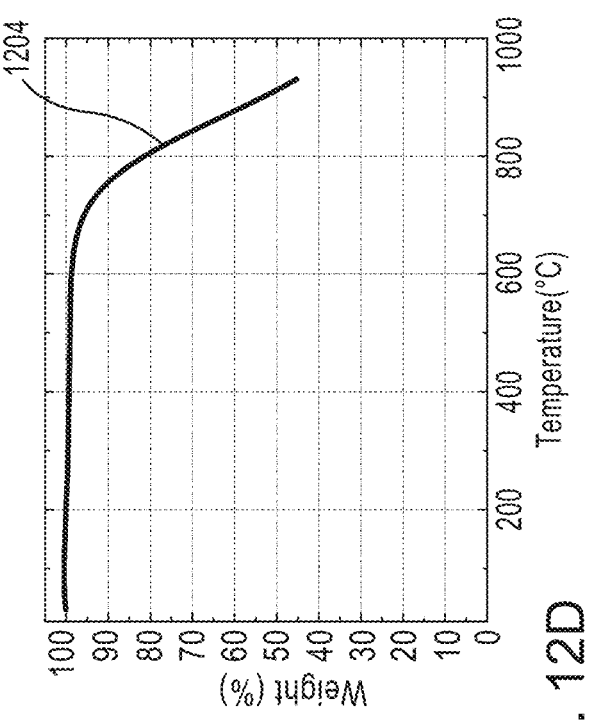

In some embodiments, the thermal stability of the graphene sheets of grades A-D may be investigated via a thermo gravimetric analysis (TGA) that tracks the thermal transitions of the materials as a function of temperature, transitions such as, but not limited to, loss of solvent and plasticizers in polymers, water of hydration in inorganic materials, and/or decomposition of the material. For example, a TGA analysis can be performed for each grade by raising the temperature of a furnace containing the graphene sheets and measuring the sample weight. In FIG. 12, the weight percentage of the sample remaining after mass loss as a function of temperature when the temperature is raised to 930° C. at a rate of 10° C./min in air is shown for the grades A and B (FIG. 12A) and Grades C and D (FIG. 12B). For grades A, B, C and D, the degradation starts at around 690° C., in contrast to 800° C. for graphite and 600° C. for a graphene layer, indicating that these grades comprise few-layer graphene products, agreeing with the results of other measurements such as Raman spectroscopy. In some embodiments, loss prior to degradation has been observed (e.g., at less than 2%) and can be ascribed primarily to residues from the washing process. The results in general show the heat resistance properties of grades A-D graphene sheets.

With reference to FIG. 1, in some embodiments, the graphene sheets of the first step of the two-step milling process (e.g., thinned graphene sheets of grades A, B, C and/or D) may be mixed with a strong oxidizer and a non-polar solvent for the second step of the milling process, e.g., step 104. In some embodiments, the strong oxidizer and the non-polar solvent may be added into the same milling vessel as the one used for producing the resulting products. In some embodiments, if the graphene sheets may have been removed from the milling vessel for post-processing, the processed (e.g., washed, filtered, etc.) graphene sheets may be re-introduced into the grinding or milling vessel. In some embodiments, the milling process may take place in a grinding vessel or jar that is different than the one used during the first step. For example, the first milling vessel may have been drained, and the graphene sheets from the first step, a strong oxidizer, a non-polar solvent and at least some of the ingredients of the first step such as the polar solvent, the weak oxidizer, the metal hydroxide salt, the surfactant and grinding media may be added into the mixture (for example, in the manners (i.e., amounts, concentration, proportions, etc.) as described above with respect to the first step of the milling processes) to commence the second-step of the two-step milling process. Although termed as a "two-step" process, in some embodiments, the disclosed milling process can be viewed as a single step process where precursor graphite is milled to reduced its thickness to few layers or less, and the resulting graphene product is further milled in the presence of a strong oxidizer to cause the charging, hydroxylation and at least partial oxidation of the resulting product.

In some embodiments, the weak oxidizer may be included in the second step so as to continue the shearing and/or exfoliation process during the second step. For example, the crystalline precursor graphite may have been reduced to about 5 hydroxylated graphene sheets after the first step of the milling process, and the presence of the weak oxidizer during the second step may assist in reducing the thickness of the thinned graphene sheets from about 5 layers to about 1-layer, 2-layer, 3-layer graphene sheets, and/or the like.

In some embodiments, the strong oxidizer may be formulated to interact with the hydroxyl ions bonded to the edges of the graphene sheets so as to convert the hydroxyl ions into a carbonyl group. As used herein, a "strong" oxidizer refers to a chemical agent with an oxidation potential greater than about 1.5V. Examples of a strong oxidizer include potassium permanganate, iron chloride, persulfate, fluorine, any combination thereof, and/or the like. In some embodiments, the strong oxidizer accomplishes the conversion of hydroxyl ions to carbonyls by removing the hydrogen atom from the hydroxyl ion, resulting in the formation of a double bond between the remaining oxygen atom and a carbon atom on the graphene sheets. In some embodiments, the proportion of hydroxyl ions at the edges of the graphene sheets that convert to carbonyl groups depends on the amount, concentration, type, etc., of the strong oxidizer used. For example, using potassium permanganate as a strong oxidizer, the second step of the two-step milling process may accomplish the conversion of about 20% of the hydroxyl at the edges of the graphene sheets to carbonyls.

In some embodiments, the non-polar solvent used during the second step of the two-step milling process may be configured to aid in the production of hydroxyl ions as well as in the diffusion of the ions in the electrolyte solution, which may facilitate the eventual bonding of the hydroxyl ions to the edges of the graphene sheets. For example, the non-polar solvent may increase the conductivity of the solution, thereby enhancing the transfer of electrostatic charge through the solution so as to allow the charges to ionize the metal hydroxide salt and produce metal cations and hydroxide anions (i.e., hydroxyls). Further, a higher concentration of non-polar solvent in the electrolyte solution may increase the diffusion length of hydroxyl ions in the solution, facilitating the bonding of hydroxyl ions to the edges of the graphene sheets.

In some embodiments, the non-polar solvent may also be configured to aid in the production of electrostatic charges during the rotation of the milling vessel during the second step of the two-step process. In addition, the non-polar solvent may enhance the exfoliation and/or shearing of sheets of graphene layers from the ordered crystalline graphite (e.g., besides the solvent's role in the production of electrostatic charges which, as discussed above with respect to the first step of the milling process, contributes to the production of atomic oxygen that exfoliates crystalline graphite). For example, the non-polar solvent may intercalate crystalline graphite and weaken the bonds (e.g., van der Waals bonds) that keep the layers of graphitic materials bound in layers.

Examples of non-polar solvents comprise organic solvents, including organic molecules and ions. For example, organic solvents such as Toluene and N-Methyl-2-pyrrolidone can be used as non-polar solvents in the electrolyte solution during the second stage of the two-step processes. As additional examples, heptane, N,N-Dimethylformamide, acetonitrile, chlorobenzene, dimethyl sulfoxide, N-methyl-2-pyrrolidinone, and/or the like can be used as non-polar solvents for at least any of the above purposes. In some embodiments, the amount, concentration, type, etc., of the non-polar solvent used during the second stage may depend on the solubility of graphitic materials like graphene in the different solvents. For example, the solubility of graphene may be different in different solvents, and the solvent providing maximum solubility to graphene may be chosen for inclusion into the electrolyte solution. Accordingly, the amount of the polar and/or non-polar solvent included during the second stage may be proportional to teach other.

For example, in some embodiments, water and ethanol may be used in the proportion ranging from about 1000:1 to about 10:1, from about 800:1 to about 100:1, 400:1 to about 200:1, and/or the like, by volume.

With reference to FIG. 1, in some embodiments, the graphene sheets of the first step of the milling process, the strong oxidizer, the non-polar solvent, the polar solvent, the weak oxidizer, the metal hydroxide salt and the surfactant may be rotated in a milling vessel or jar at a desired speed for a period configured to allow the conversion of the hydroxyl ions bonded to the edges of the graphene sheets, e.g., step 105. For example, the highly charged and hydroxylated graphene sheets may be milled for about 2 to 10 hours until a brown, fluffy powder is produced. In some embodiments, the milling period may range from about 2 hour to about 8 hours, from about 2 hour to about 6 hours, from about 2 hour to about 4 hours, and/or the like. The rotation speed may be medium, in the range of from about 100 rpm to about 500 rpm, from about 200 rpm to about 400 rpm, from about 200 rpm to about 250 rpm, and/or the like. In some embodiments, the grinding media (including type, amount, size, proportion to graphitic material to be milled, etc.) used during this second step of the two-step milling process may be similar to those utilized during the first step.

In some embodiments, similar to the case of the first step of the milling process, the second step may also be interrupted every so often to allow the escape of gas that has built up during the rotation of the milling vessel or jar. For example, in some embodiments, the milling process may be stopped every about 30 minutes to evacuate gaseous by-products for safety reasons. In some embodiments, the process of milling may also be performed so as to avoid evaporation of solvents such as water from the aqueous electrolyte solution. For example, the milling vessels or jars used in the milling processes may be kept at a temperature formulated to avoid evaporation of the solvents, such as room temperature.

In some embodiments, the resulting products of the second milling step, which may appear brown and have a fluffy structure, may be post-processed to at least remove extraneous by-products or residues such as but not limited to metallic ions, surfactants, metal salts, etc., e.g., step 106 of FIG. 1. For example, the product may be washed with one or more of water, hydrochloric acid (HCl), ethanol, etc., and the washing may be followed by vacuum filtration and vacuum drying. The resulting final product of the two-step milling processes can be single or thinned few layer graphene sheets that are highly electrostatically charged, hydroxylated and partially oxidized. For example, these graphene sheets can be partially oxidized graphene sheets with hydroxylated edges where at least some of the hydroxyls are converted into carbonyl molecules, which tend to be more active for bonding with other materials than the hydroxyl groups. In some embodiments, the portion of hydroxyl ions that convert into carbonyls may range from about 10% to about 40%, from about 15% to about 35%, from about 15% to about 30%, about 20%, etc., of the hydroxyls. The conversion allows graphene sheets to exhibit enhanced dispersibility and mixability in both polar and non-polar solvents, which results from electrons that are released in solvents such as water during the breaking of one of the double bonds that bind carbon and oxygen atoms in a carbonyl molecule. Accordingly, the final product shows good dispersibility and mixability in various matrixes such as polar solvents, non-polar solvents, polymers, and/or the like, for example.

In some embodiments, the disclosed two-step process can produce a large quantity of graphene sheets that are highly electrostatically charged, hydroxylated and partially oxidized in a single setting, representing a high yield of about 92% under certain conditions. In some embodiments, the yield may range from about 85% to about 95%.

At least some embodiments of the second step of the disclosed two-step milling process have been employed experimentally to treat the graphene sheets of the first stage of the two-step process as discussed herein. In some embodiments, the final graphene sheets of the two-step process following the second stage can be conveniently classified into the following class or grade:

Grade F: A highly activated few-layer graphene of about 2 to 3 graphene layers with at least some of the hydroxyl groups at the edges of the graphene sheets have oxidized to form carbonyl groups. Grade F can further be classified into grades F1 and F2 based on at least the lateral sizes of the graphene sheets, and/or the ratio of carbonyl to hydroxyl attached to the edges of the graphene sheets. Grade F1 usually have more carbonyls and exhibit different properties than grade F2 graphene sheets. For example, some of the graphene sheets can have a lateral size (e.g., flake diameter) in the range of from about 0.1 μm to 0.2 μm (Grade F2) and 0.2 μm to 0.5 μm (Grade F1).

In some embodiments, Raman spectroscopy can be used to characterize the properties of grade F graphene sheets such as thickness, defect density, etc. Using visible light (e.g., 532 nm wavelength light corresponding to 2.33 eV energy), the Raman spectra for grade F FLG may be obtained as shown in FIG. 5, which shows the G, D and 2D peaks that are discussed above with reference to with respect to grades A, B, C and D. Using similar techniques described above for obtaining the thicknesses of grades A-D, the thicknesses of grade F graphene sheets may be determined to be about 1 to 3 graphene layers.

Figure 10A:
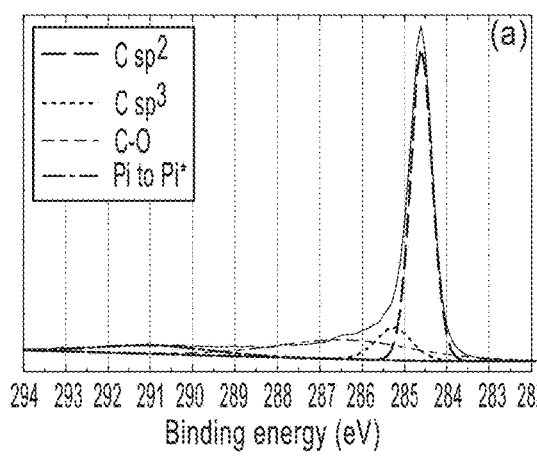
FIGS. 10A-10F are examplary plots of X-ray photon spectroscopy (XPS) spectra for a series of different few-layer graphene sheets and bulk graphite, according to an embodiment.
Figure 10B:
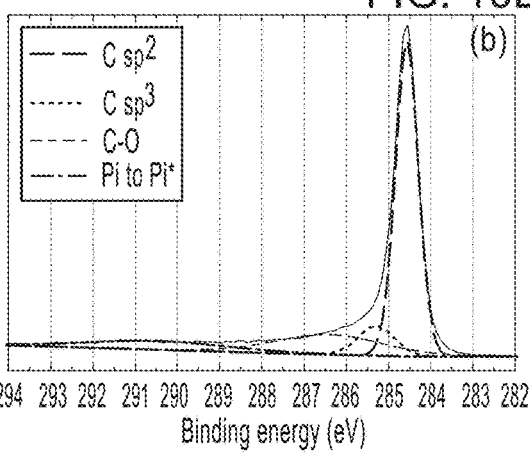
Figure 10C:
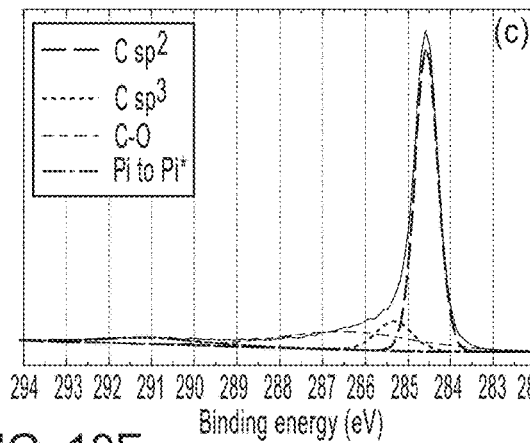
Figure 10D:
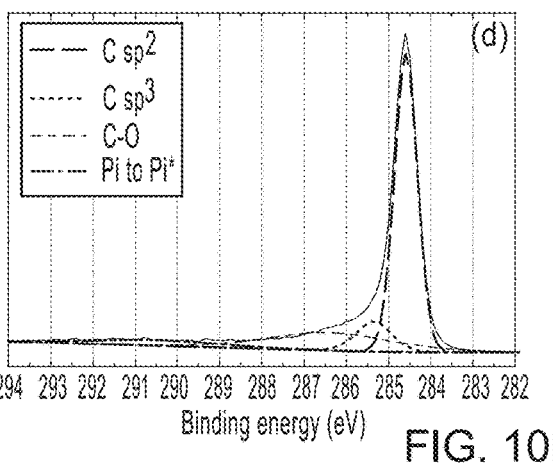
Figure 10E:
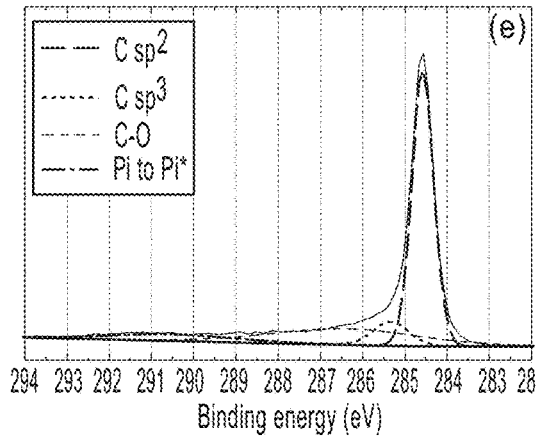
Figure 10F:
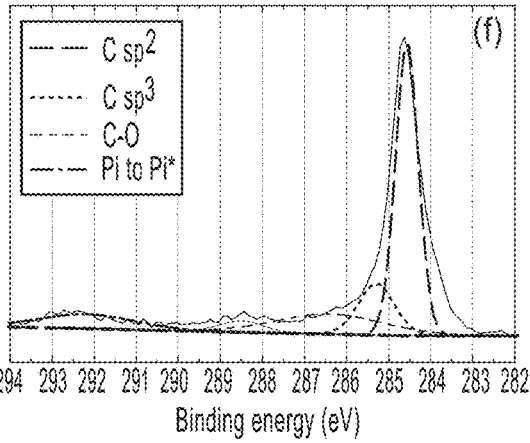
Figure 11:
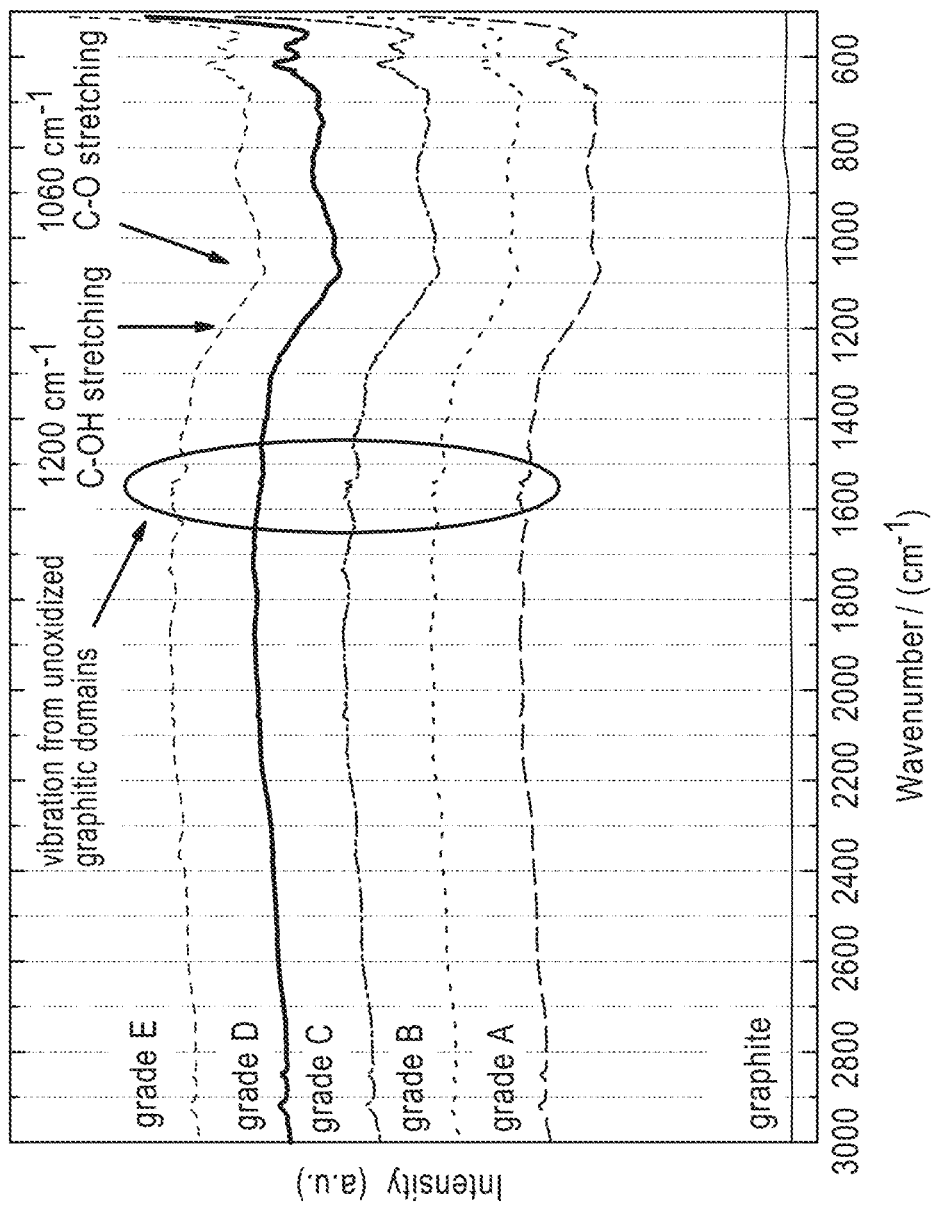
FIG. 11 is an example plot of example Fourier transform infrared spectroscopy by attenuated total reflection (ATR-FTIR) spectra for a series of different few-layer graphene and bulk graphite, according to an embodiment.

Similarly, XPS may be used to characterize the surfaces and identify the hydroxyl groups attached to grade F graphene sheets, as shown in FIG. 10F, where the aforementioned four intensity peaks can be identified, corresponding to peaks from carbon $sp^2$, carbon $sp^3$, carbon-oxygen (C—O) and π-π bond. Integrals, i.e., summation of the intensities of each peak for grade F is tabulated in Table 1 above, indicating that grade F graphene sheets comprise activated edges with hydroxyl groups.

TABLE 2

| | C1s sp3 | C1s sp2 | C1s C—O | C1s C=O |
|---|---|---|---|---|
| Graphite | 16% | 63% | 21% | 0% |
| Electrostatically Charged Graphene | 11% | 66% | 23% | 0% |
| Partially Oxidized Graphene | 16% | 60% | 19% | 3.94% |

FIGS. 6A-6G show the deconvoluted XPS Carbon 1s spectra of Grade F. The main difference from the other grades is the emergence of a new peak around 287.5 eV that can be attributed to carbonyl, which is confirmed by the non-zero value for the integration of the peaks that indicates a 3.94% presence of carbonyl groups (as shown in the table above, Table 2), in contrast to the vanishing values for grades A-D. Hydroxyl group quantification is lower in Grade F compared to Grades A to D, and it is noticeable that the difference corresponds with the quantification of carbonyl groups, leading to the conclusion that some hydroxyl groups have been oxidized to form carbonyl.

Figure 14C:
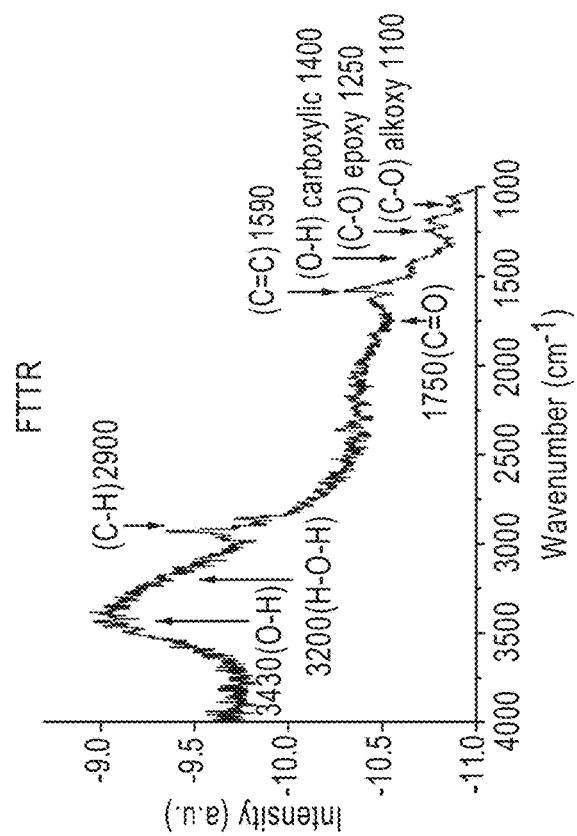
FIGS. 14A-14C are example plots of XPS, TGA, and FTIR spectra of at least partially oxidized graphene, respectively, according to an embodiment.

In some embodiments, FTIR measurements can provide additional supporting evidence as to the XPS detection of the presence of carbonyl groups on the edges of grade F FLGs. For example, FIG. 14C shows the FTIR spectra of grade F FLGs where several significant absorption bands, corresponding to different local environments, can be identified:

- around 1100 cm$^{-1}$ wavenumber, due to the stretching mode of alkoxy C—O bonds,
- around 1250 cm$^{-1}$ wavenumber, due to the epoxy C—O asymmetric stretching vibrations,
- around 1400 cm$^{-1}$ wavenumber, associated with the carboxy O—H bonds,
- around 1590 cm$^{-1}$ wavenumber, corresponding to C=C, from the non-oxidized sp$^2$ carbon bonds,
- around 1750 cm$^{-1}$ wavenumber, associated with C—O, stretching vibrations,
- around 3200 cm$^{-1}$ wavenumber, comprising contribution from the adsorbed water molecules, and
- around 3430 cm$^{-1}$ wavenumber associated with the O—H oscillations in the carboxylic groups, on the edges of graphene planes, as well as in between the graphene sheets.

Figure 14A:
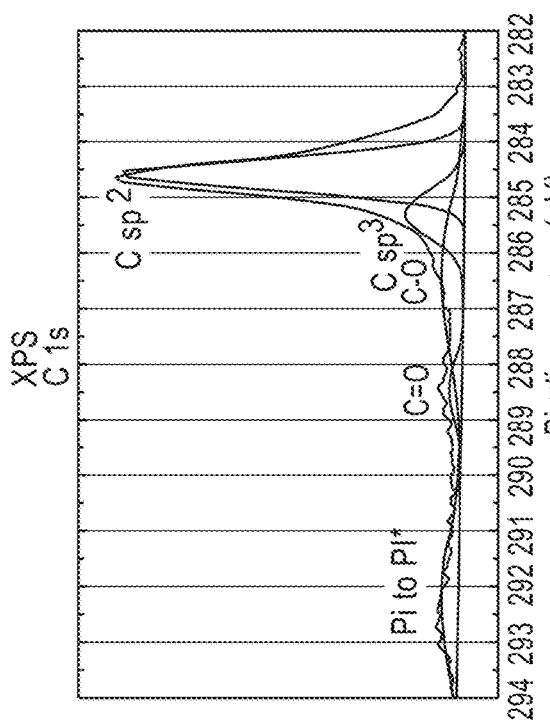
Figure 14B:
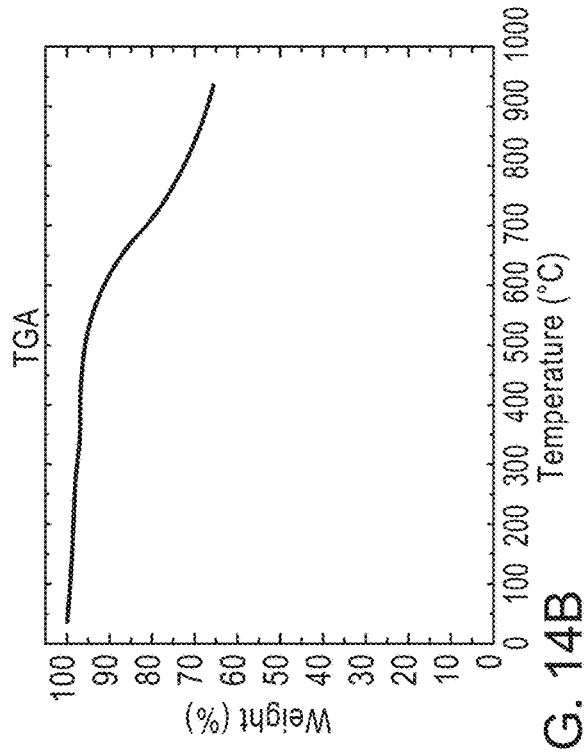

These measurements show that carbonyl groups were added to the hydroxyl groups on the edges of the platelets, and in general provide further evidence of edge activation of the graphene sheets. FIG. 14 provides additional example plot of XPS, TGA, and FTIR spectra of (partially) oxidized graphene, according to an embodiment.

Figure 12C:
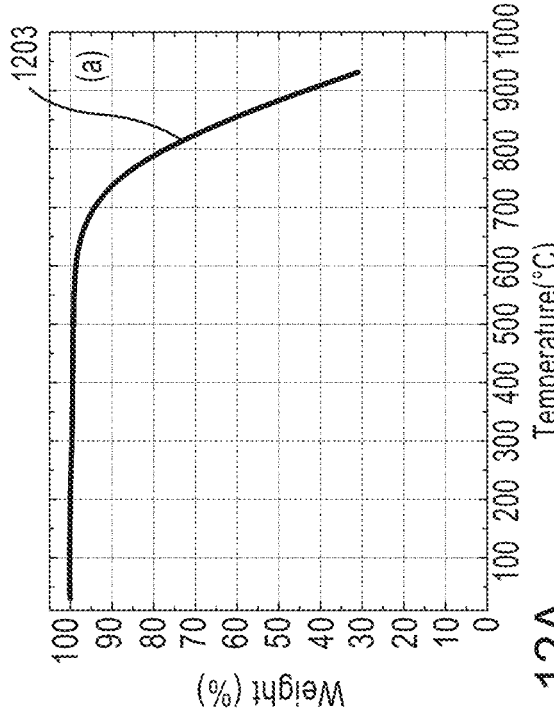
Figure 12D:
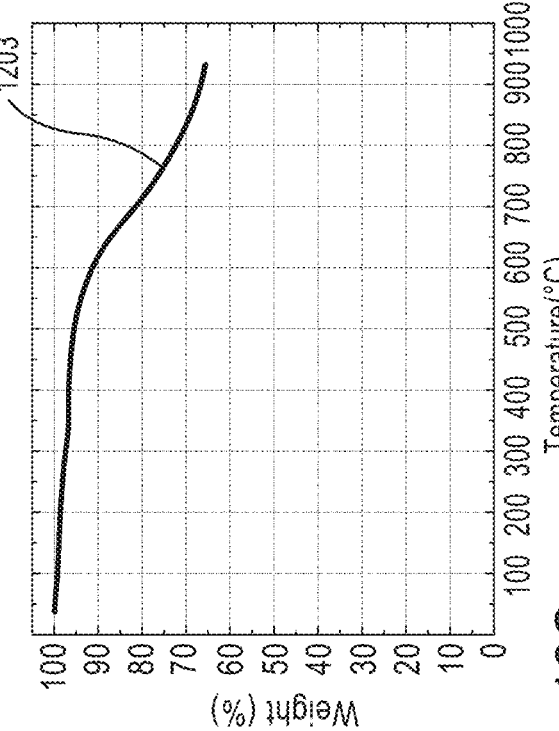
Figure 13B:
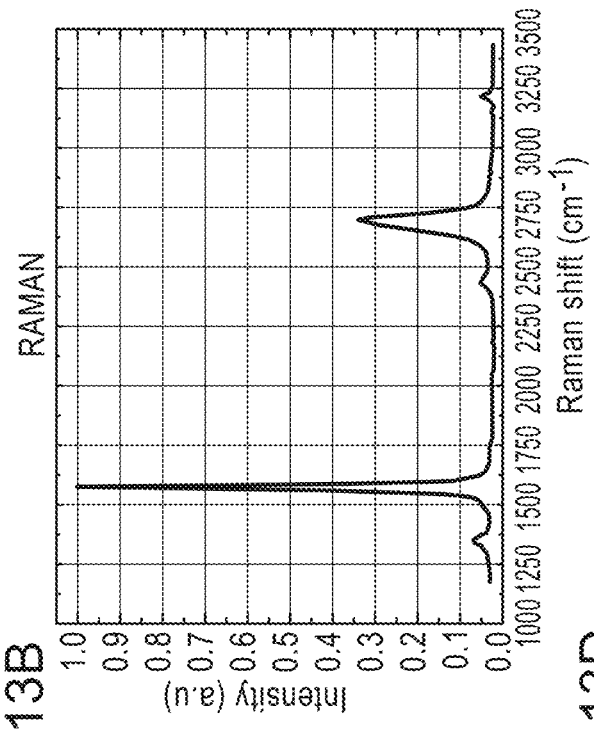
FIGS. 13A-D are example plots of XPS, Raman, thermo gravimetric analysis (TGA), and FTIR spectra of electrostatically charged and hydroxylated graphene, respectively, according to an embodiment.
Figure 13D:
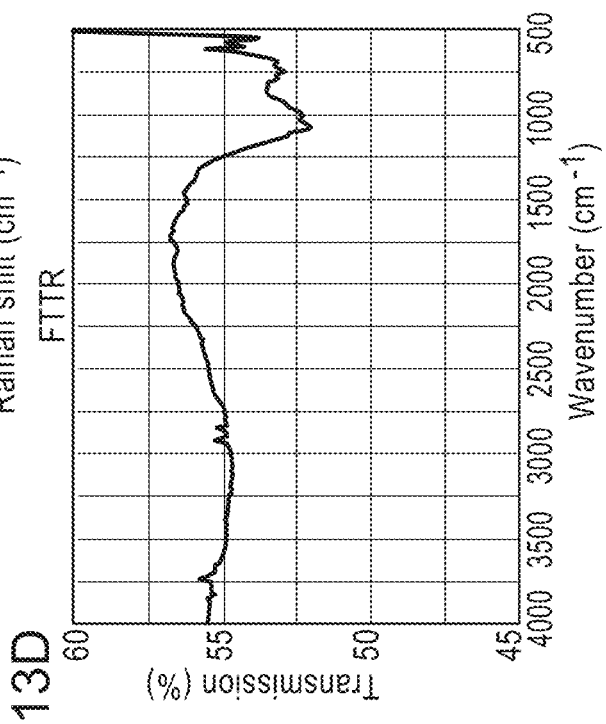
Figure 13A:
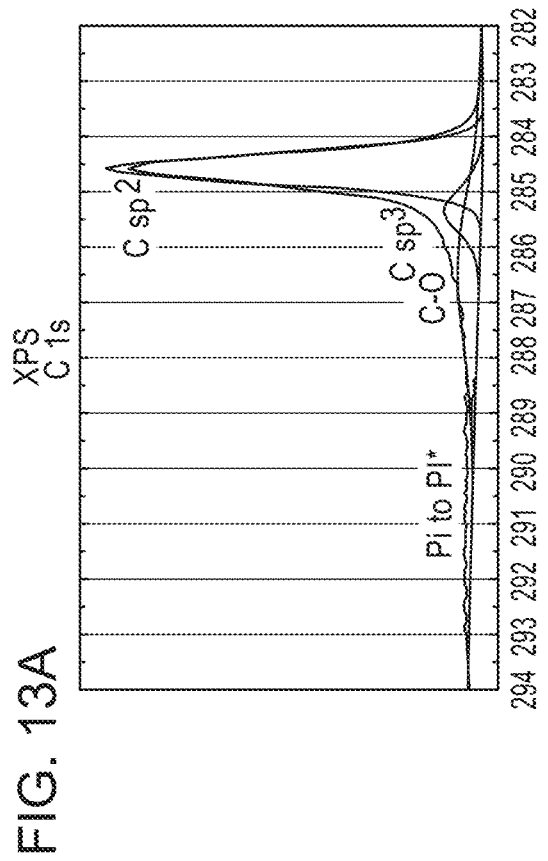
Figure 13C:
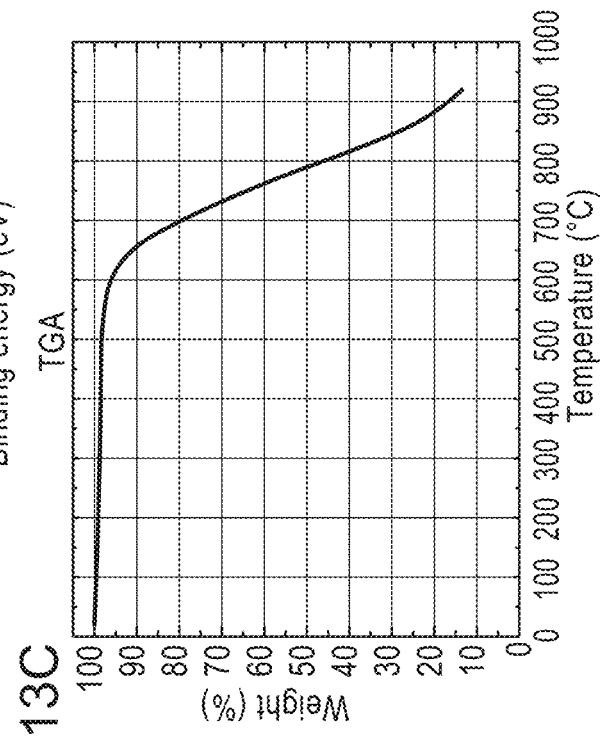

In some embodiments, the thermal stability of the graphene sheets of grade F may also be investigated via a thermo gravimetric analysis (TGA) similar to as discussed above with reference to grades A-D. For example, a TGA analysis can be performed by raising the temperature of a furnace containing grade F graphene sheets and measuring the sample weight. FIG. 12C shows the weight percentage of the sample remaining after mass loss as a function of temperature when the temperature is raised to 930° C. at a rate of 10° C./min rate in air. In the figure, two weight decreases can be observed in the TGA data, where at around 250° C., structural water, hydroxyl and carbonyl groups are removed from the powder, and at around 592° C., the decomposition of the graphene sheets occurs. This decomposition temperature can be slightly lower than that for Grade D but still very close, showing that the pristine nature of the graphene sheets has been conserved during the milling processes. The results also show the heat resistance properties of grade F graphene sheets.

Applications

The different grade graphene sheets and related composites produced according to the disclosed processes can be used to improve material performance across a wide range of industries. Addition of even a minute amount of graphene-polymer composites can dramatically improve the properties of base polymers to which the graphene materials are added, partly due to the dispersability of the low defect graphene sheets of the various grades. For example, a low graphene loading level ranging from about 0.05% to about 0.2% by weight may lead to significant performance improvements. As a specific example, adding about 0.5 wt % of the disclosed graphene to PEI (Polyetherimide) may result in excellent anti-corrosion coatings and adding just 0.2 wt % to silicone rubber may increase the thermal conductivity by almost 450%. Excellent improvements in the properties of materials such as polylactic acid (PLA), polyethylene (PE), ultra-high-molecular-weight polyethylene (UHMWPE), Polyetherimide (PEI), acrylonitrile butadiene styrene (ABS), silicone rubber, etc., can also be achieved, such properties including thermal conductivity, anti-corrosion and mechanical strength. The ability to achieve large performance improvements with very little graphene makes the graphene sheets economically viable for a large number of applications across a wide range of industries.

Some of the techniques that can be used to disperse graphene in multiple matrixes such as water and oil based lubricants or even polymers comprise dispersing partially oxidized graphene in the ethanol initially and produce a master batch. In some embodiments, partially oxidized graphene may represent a fair dispersibility in water although its stability may be limited to a few days. Further, partially oxidized graphene may represent a high dispersibility and stability in non-polar solvents such as ethanol. For example, ethanol can act as a carrier for partially oxidized graphene and improve the stability of such products in the aqueous mediums. Adding a solution of partially oxidized graphene into lubricants can improve the lubricity of such liquids dramatically. For example, adding about 0.1 wt % of partially oxidized graphene dispersed in the ethanol into paraffin oils can reduce friction by about 66%. As another example, dry adding partially oxidized graphene into silicone rubbers can enhance the tensile strength dramatically while improving the hydrophobicity of the surface. Such products can have multiple applications in the aerospace industry such as de-icing layers or as conductive paints for anti-lightening.

Lubricants

Graphene can provide significant benefits for lubricants in at least three ways, including as an additive to improve oil-based lubricants, as a replacement for existing, hazardous additives (e.g., for current environmentally unfriendly lubricant additives such as molybdenum disulfide or boric acid), and as a replacement for graphite-based lubricants. As an additive, for example, adding graphene to existing oil-based lubricants provides many advantages including reducing friction, forming an extremely strong and durable surface layer on the target surfaces that can be stable under a wide range of loads and temperatures, improving lubricants to act as excellent cooling fluid removing heat produced by friction or from external sources, and improving lubricants to protect surfaces from the attack of aggressive products formed during operation (including anti-corrosion protection). For example, a test by lubricant specialists of the graphene of the various grades has shown a very low loading of about 1 mg/mL in paraffin oil, the coefficient of friction was reduced by about 66%.

Graphite is a commonly used solid lubricant, especially in moist air (but may not protect the surface from corrosion). It has been shown that graphene works equally well in humid and dry environments. Furthermore, graphene is able to drastically reduce the wear rate and the coefficient of friction (COF) of steel. The marked reductions in friction and wear can be attributed to the low shear and highly protective nature of graphene, which also prevents oxidation of the steel surfaces when present at sliding contact interfaces.

Using the graphene-based products of the wet ball milling processes disclosed herein as additives, even in minute amounts such as between 1.0% and 0.1% of graphene by weight as an additive, the above-mentioned advantages of graphene in lubricants can be realized. Further, the minute amount creates minimal or no impact to existing manufacturing processes, also allowing for a compact product development and introduction timeline. The higher quality of the graphene-based products allow for minute amounts to achieve significant improvements in lubricant performance, which partly is the result of the ability to tune the dimensions of the graphene nanoplatelets and their dispersiveness in other materials. In some embodiments, it is useful to have the ability to tune the dimensions of the graphene nanoplatelets depending on the target application. The dimensions can be lateral size (e.g., diameter)—larger nanoplatelets generally provide more continuous surface protection, and dispersion—smaller particles are often more easily dispersed in the target lubricant.

Coatings and Paints

Coatings are used to improve the surface properties of a substrate, properties such as corrosion resistance, durability, wettability, and adhesion. Paints are a special category of coating, used to protect, beautify and reduce maintenance requirements. Graphene, alone or as part of a composite, displays excellent characteristics for the coating industry including water and oil resistance, extraordinary barrier properties (including anti-corrosion), superb frictional properties, and high wear resistance. In addition, graphene has excellent electrical and thermal properties and thin layers of graphene are optically transparent. Further, graphene based coatings exhibit excellent mechanical properties as well as being largely or completely impermeable to gases, liquids and strong chemicals. Examples include using graphene based paint to cover glassware or copper plates that may be used as containers for strongly corrosive acids. Other areas of applications include industries in medicine, electronics, nuclear and shipbuilding, were identified. The graphene based products of the wet ball milling processes of this disclosure can be used to accomplish the aforementioned applications of graphene in as a coating additive.

Composite Materials

Composite materials are made from two or more different materials that are combined together to create a new material with characteristics different from the individual components. The goal is to create a superior new material with improved performance in some aspect such as strength, less weight or lower cost. Graphene, with its unprecedented array of material characteristic improvements, is a natural candidate for use in advanced composite materials. Leading candidates for graphene-based composites include structural and skin components for airplanes, cars, boats and spacecraft. In these applications, graphene can be used to increase thermal conductivity and dimensional stability, increase electrical conductivity, improve barrier properties, reduce component mass while maintaining or improving strength, increase stiffness and toughness (impact strength), improve surface appearance (scratch, stain and mark resistance), and increase flame resistance. The graphene based products including the graphene-graphite composite and the edge activated FLGs discussed in this disclosure can be used just for such applications. Examples of the effects of these products include improving mechanical/structural properties, thermal and/or electrical conductivity, wear resistance and long lasting surface properties, anti-corrosion and anti-erosion properties, particularly under dynamic loads; and electromagnetic shielding.

Experimental Demonstration of Effects of Grades of Graphene on Mechanical Properties Polymers can be highly adaptable and as such can be used in a wide range of challenging engineering applications, from composite wind turbine blades in the renewable energy sector to highly complex structural parts of aeroplanes. The incorporation of graphene in the polymer matrix can be a highly effective way to improve the mechanical properties of polymers. Table 3 below shows an experimental demonstration of the impact of grade F2 graphene additive powder on tensile strength and elongation at break in a commonly-used rubber compound consisting of natural and synthetic rubber. Mechanical properties were measured according to American Society for Testing and Materials standard (ASTM) D412 (Standard Test methods for Vulcanized Rubber and Thermoplastic Elastomers) with an Instron 3365 machine. The graphene-infused rubber sample was found to have a tensile strength of about 13 MPa which is an about 11% improvement. The tensile strain at break also increased by about 22.7% making the resultant material more ductile and flexible.

Tensile strength and strain at break were also evaluated for acrylated monomer base resins used for UV cured 3D printing materials. The pure base resin was mixed with graphene and cured. Traction dogbones were then tested following ASTM D0638 standards, and a 57% increase in tensile strength was observed in samples containing about 0.5% wt graphene and the tensile strain at break almost doubled as well.

Figure 16:
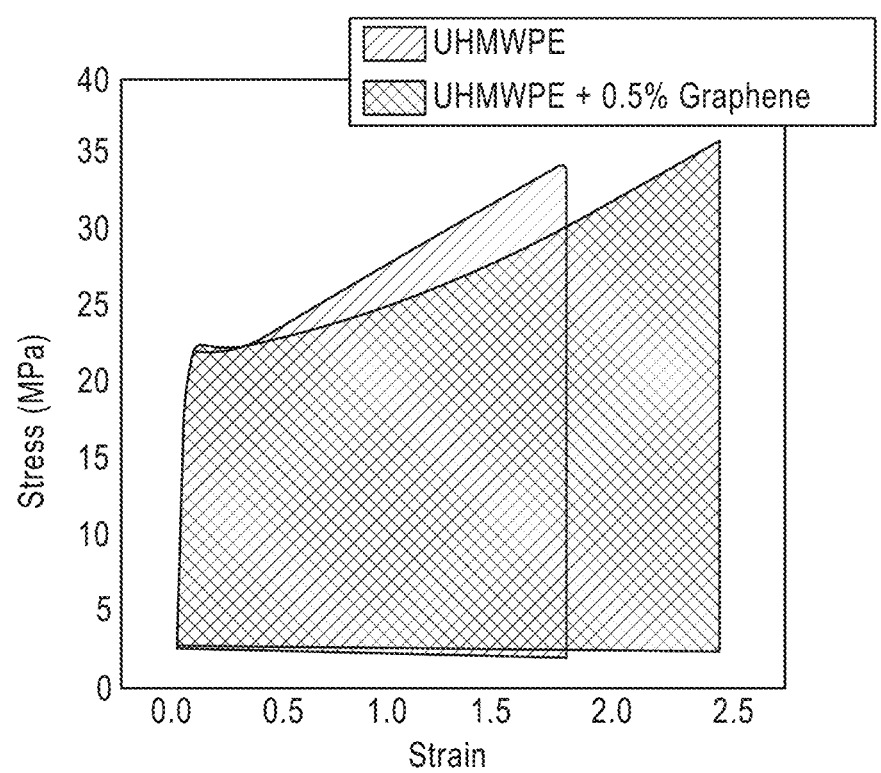
FIG. 16 shows an example experimental demonstration of the effect of adding about 0.5 wt % of grade D graphene into UHMWPE (Ultra High Molecular Weight Polyethylene), according to an embodiment.

In some embodiments, toughness describes the ability of a material to absorb energy and plastically deform without fracturing and it may be an important material property for design applications. FIG. 16 shows an example experimental demonstration of the effect of adding about 0.5 wt % of grade D graphene into UHMWPE (Ultra High Molecular Weight Polyethylene), which increased the toughness by about 40%. To achieve comparable enhancement with carbon nanotube (CNT) and nanoparticle epoxy composites, one to two orders of magnitude loadings may be used.

Thermal Management

The demand for innovative thermal management materials and adhesives is driven by the harmful heat generated by ever-shrinking electronic components and systems in all areas of the electronics market, including aerospace, automotive, consumer, communications, industrial, medical, and military. In recent years, there has been an increasing interest in new and advanced materials for thermal interface mate rials (TIM) and heat conduction. The important basic factors to consider when selecting a thermal interface material (TIM) are a high, thermally conductive interface material that is as thin as possible, a material that forms an excellent thermal interface with a wide range of materials and a material that eliminates voids or air pockets between the heat generating device surface and the heat sink surface. The graphene based products disclosed in this disclosure possess superior electrical conductivity, and ultra-low interfacial thermal resistance against metal, and as such are suitable for thermal management applications. Further, the edge activation facilitates mixing with other materials such as existing TIM materials. As such, for example, they can be used in producing thermally conductive polymer composites that can provide opportunities to form complex, light weight, three-dimensional and eco-friendly objects and devices. For example, thermally conductive polymer composites can be used to produce microelectronic enclosures, passive heat sinks with complex shapes, novel electrical motor casings, and/or the like with superior heat dissipation performance.

reflectance sensor to apply a momentary constant heat source can be used to measure thermal properties (e.g., conductivity) of polymer materials. For example, thermal conductivity and effusivity can be measured directly using such a technique, providing for a detailed profile of the thermal characteristics of the samples being measured. Table 1 below shows an experimental demonstration of the significant impact on the thermal conductivity of different polymers that can be obtained by using graphene sheets of the various grades. As an example, the thermal conductivity of PLA can be increased by approximately 250% with the addition of about 0.075 wt % of grade F2 graphene.

TABLE 4

| Material | Thermal Conductivity at 21-25° C. (W/mK) | Improved Thermal conductivity | Thermal Effusivity (Ws$^{0.5}$/m$^2$K) | Improved Thermal Effusivity |
|---|---|---|---|---|
| PLA* | 0.36 | 245% | 714 | 112% |
| PLA + 0.075 wt % Graphene Grade F2 | 1.23 | | 1517 | |
| PE** | 0.74 | 44% | 888 | 55% |
| PE + 0.1 wt % Graphene Grade D | 1.06 | | 1377 | |
| ABS*** | 0.29 | 339% | 643 | 142% |
| ABS + 0.05 wt % Graphene Grade F2 | 1.28 | | 1555 | |
| Silicone rubber | 0.23 | 446% | 572 | 166% |
| Silicone rubber + [0.1 wt % Graphene Grade F1 + 0.1 wt % Graphene Grade F2] | 1.24 | | 1522 | |
| 2-part epoxy potting compound | 0.38 | 45% | 771 | 17% |
| 2-part epoxy potting compound + 0.075 wt % Graphene Grade SD | 0.55 | | 905 | |
| Silicone heat transfer compound | 0.66 | 54% | 1190 | 15% |
| Silicone heat transfer compound + 0.1 wt % Graphene Grade D | 1.02 | | 1367 | |
| Polyurethane | 0.21 | 80% | 550 | 33% |
| Polyurethane + 0.13 wt % Grade F2 | 0.37 | | 730 | |

As discussed above, graphene sheets produced using the processes disclosed herein significantly improve the thermal properties of polymers the graphene sheets are mixed with, especially in comparison to graphitic materials produced using other processes. Table 2 provides an example of such an effect with respect to graphene/PLA conductive thermoplastic polymer.

TABLE 5

| | Graphene produced by the disclosed two step milling processes | Graphene not produced by the disclosed two step milling processes |
|---|---|---|
| Loading level of graphene | 0.075 wt % | 10-15 wt % |
| Improvement in thermal conductivity | 245% | 40-50% |

Figure 15:
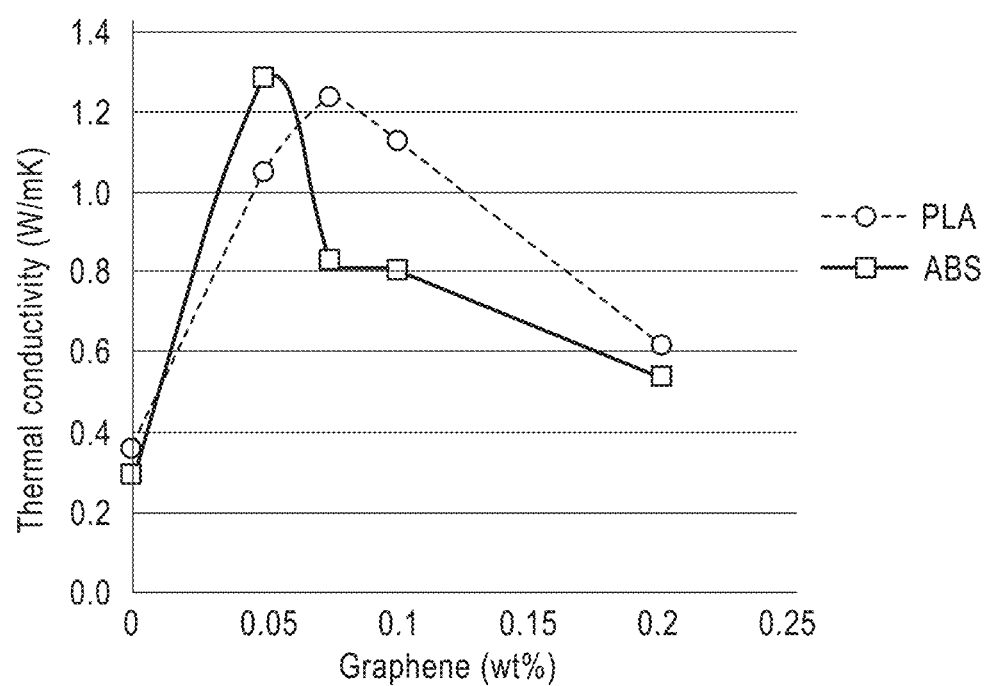
FIG. 15 shows an example plot of thermal conductivity of graphene/polylactic acid (PLA) as a function of graphene concentration by weight, according to an embodiment.

Experimental Demonstration of Effects of Grades of Graphene on Thermal Properties In some embodiments, a Modified Transient Plane Source (MTPS) technique that employs a one-sided, interfacial heat In some embodiments, there may be an optimum range and/or value of graphene amount that can be mixed with a material so as to produce a composite with desired enhanced properties. For example, for any target polymer, one or more of the aforementioned graphene grades can be mixed at very small concentrations (usually around 0.1% by weight) to improve intrinsic heat dissipation properties of the polymer. In some embodiments, the concentration of graphene can be finely tuned so as to discover an optimal value that achieves the desired properties (e.g., highest thermal conductivity). FIG. 15 shows an example embodiment of the determination of an optimal concentration of graphene for PLA and ABS. For example, in the case of PLA, the optimal graphene concentration is about 0.075% by weight.

Energy

Graphene-based nanomaterials have many promising applications in energy-related areas. Graphene improves both energy capacity and charge rate in rechargeable batteries; graphene makes superior supercapacitors for energy storage; transparent and flexible graphene electrodes may lead to a promising approach for making solar cells that are inexpensive, lightweight and manufactured using roll-to-roll techniques; graphene substrates show great promise for catalytic systems in hydrogen storage for automotive and grid storage applications.

The graphene based products of the present disclosure can be particularly suited to electrode-based energy solutions, and specifically for improving the performance of Li-ion anodes. Current Li-ion anodes are made from graphite while new generation anodes are being fabricated from composites such as silicon-carbon. Graphene composite anodes, fabricated using a composite of graphene and metals, oxides or polymers, can have even better performance in the areas of power density, energy density, and battery cycle life. Further, graphene based composites can often provide production advantages while also helping to address the overheating and swelling problems often experienced by advanced battery cells. In addition, the excellent thermal and electrical conductivity, and the ability to mix and form composites with a wide range of other materials, of the graphene based products of the present disclosure allow for its use in battery technologies, including effecting improvements in the performance of Li-ion batteries.

While various embodiments of the system, methods and devices have been described above, it should be understood that they have been presented by way of example only, and not limitation. Where methods and steps described above indicate certain events occurring in certain order, those of ordinary skill in the art having the benefit of this disclosure would recognize that the ordering of certain steps may be modified and such modification are in accordance with the variations of the invention. For example, the non-aqueous electrolyte can also include a gel polymer electrolyte. Additionally, certain of the steps may be performed concurrently in a parallel process when possible, as well as performed sequentially as described above. The embodiments have been particularly shown and described, but it will be understood that various changes in form and details may be made.

The invention claimed is:

1. A method for producing functionalized graphene, comprising:
    transferring graphite into a milling vessel, the graphite having a first aspect ratio;
    transferring a solvent into the milling vessel;
    transferring a surfactant into the milling vessel;
    transferring a first oxidizing agent into the milling vessel;
    transferring a second oxidizing agent into the milling vessel; and
    milling the graphite in the presence of the solvent, the surfactant, the first oxidizing agent, and the second oxidizing agent to produce functionalized graphene, the functionalized graphene having a second aspect ratio, the second aspect ratio larger than the first aspect ratio.

2. The method of claim 1, wherein the solvent includes water.

3. The method of claim 1, wherein the first oxidizing agent includes a metal hydroxide salt.

4. The method of claim 3, wherein the metal hydroxide salt includes potassium hydroxide.

5. The method of claim 1, wherein the first oxidizing agent has an oxidation potential greater than about 1.5V.

6. The method of claim 1, wherein the first oxidizing agent has an oxidation potential less than about 1.5V.

7. The method of claim 1, wherein the functionalized graphene is hydroxylated.

8. The method of claim 7, further comprising:
    converting a hydroxyl group of the functionalized graphene to a carbonyl group.

9. The method of claim 1, wherein the functionalized graphene is carbonylated.

10. The method of claim 1, wherein the functionalized graphene is few layer graphene.

11. The method of claim 1, further comprising:
    isolating the functionalized graphene;
    washing the functionalized graphene; and
    filtering and drying the functionalized graphene.

12. The method of claim 1, wherein the second oxidizing agent includes a peroxide.

13. A method, comprising:
    transferring graphite into a milling vessel, the graphite having a first thickness, the milling vessel including a media;
    transferring a solvent into the milling vessel;
    transferring a surfactant into the milling vessel;
    transferring a metal hydroxide salt to the milling vessel;
    transferring an oxidizing agent into the milling vessel; and
    rotating the milling vessel in the presence of the solvent, the surfactant, the metal hydroxide salt, and the oxidizing agent to produce functionalized graphene, the functionalized graphene having a second thickness, the second thickness smaller than the first thickness.

14. The method of claim 13, wherein the solvent includes water.

15. The method of claim 13, wherein the oxidizing agent is at least one of a peroxide, a chromate, a chlorate, or a perchlorate.

16. The method of claim 15, wherein the oxidizing agent is hydrogen peroxide.

17. The method of claim 13, wherein the functionalized graphene is hydroxylated.

18. The method of claim 17, further comprising:
    converting a hydroxyl group of the functionalized graphene to a carbonyl group.

19. The method of claim 13, wherein the oxidizing agent has an oxidation potential less than about 1.5V.

20. The method of claim 13, wherein the functionalized graphene is carbonylated.

21. The method of claim 13, wherein the functionalized graphene is few layer graphene.

22. The method of claim 13, further comprising:
 isolating the functionalized graphene;
 washing the functionalized graphene; and
 filtering and drying the functionalized graphene.

\* \* \* \* \*